US010784335B2

(12) United States Patent
Takeuchi et al.

(10) Patent No.: US 10,784,335 B2
(45) Date of Patent: Sep. 22, 2020

(54) SILICON CARBIDE SEMICONDUCTOR DEVICE AND MANUFACTURING METHOD THEREFOR

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Yuichi Takeuchi, Kariya (JP); Shinichiro Miyahara, Kariya (JP); Atsuya Akiba, Kariya (JP); Katsumi Suzuki, Toyota (JP); Yukihiko Watanabe, Nagakute (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/305,164

(22) PCT Filed: Jun. 29, 2017

(86) PCT No.: PCT/JP2017/023987
§ 371 (c)(1),
(2) Date: Nov. 28, 2018

(87) PCT Pub. No.: WO2018/008526
PCT Pub. Date: Jan. 11, 2018

(65) Prior Publication Data
US 2019/0386096 A1  Dec. 19, 2019

(30) Foreign Application Priority Data

Jul. 5, 2016 (JP) ................. 2016-133673

(51) Int. Cl.
*H01L 29/06* (2006.01)
*H01L 29/16* (2006.01)
(Continued)

(52) U.S. Cl.
CPC .......... *H01L 29/06* (2013.01); *H01L 29/0619* (2013.01); *H01L 29/0692* (2013.01);
(Continued)

(58) Field of Classification Search
None
See application file for complete search history.

(56) References Cited

U.S. PATENT DOCUMENTS

2007/0249142 A1  10/2007  Hisanaga
2009/0200559 A1  8/2009  Suzuki et al.
(Continued)

FOREIGN PATENT DOCUMENTS

JP  2007-042997 A  2/2007
JP  2015-070185 A  4/2015
(Continued)

OTHER PUBLICATIONS

U.S. Appl. No. 16/304,783, filed Nov. 27, 2018, Takeuchi et al.
U.S. Appl. No. 16/304,752, filed Nov. 27, 2018, Takeuchi et al.
U.S. Appl. No. 16/304,866, filed Nov. 27, 2018, Takeuchi et al.

*Primary Examiner* — Steven B Gauthier
(74) *Attorney, Agent, or Firm* — Posz Law Group, PLC

(57) ABSTRACT

A top end of the p type connection layer is connected to the p type extension region. By forming such a p type extension region, it becomes possible to eliminate a region where an interval becomes large between the p type connection layer and the p type guard ring. Therefore, in the mesa portion, it is possible to prevent the equipotential line from excessively rising up, and it is possible to secure the withstand voltage.

10 Claims, 15 Drawing Sheets

(51) Int. Cl.
  *H01L 29/66* (2006.01)
  *H01L 29/78* (2006.01)
  *H01L 29/872* (2006.01)
  *H01L 29/47* (2006.01)
  *H01L 29/12* (2006.01)
  *H01L 21/04* (2006.01)
  *H01L 29/739* (2006.01)

(52) U.S. Cl.
  CPC .......... *H01L 29/0696* (2013.01); *H01L 29/12* (2013.01); *H01L 29/1608* (2013.01); *H01L 29/47* (2013.01); *H01L 29/6606* (2013.01); *H01L 29/66068* (2013.01); *H01L 29/78* (2013.01); *H01L 29/7811* (2013.01); *H01L 29/7813* (2013.01); *H01L 29/872* (2013.01); *H01L 21/046* (2013.01); *H01L 29/7397* (2013.01)

(56) References Cited

U.S. PATENT DOCUMENTS

| 2011/0309464 | A1  | 12/2011 | Yamamoto et al. |
| 2012/0126328 | A1* | 5/2012  | Lin ............... H01L 29/0634 257/368 |
| 2015/0115286 | A1* | 4/2015  | Takeuchi ........... H01L 21/8213 257/77 |
| 2016/0104794 | A1  | 4/2016  | Takeuchi et al. |
| 2017/0084735 | A1  | 3/2017  | Takeuchi et al. |
| 2018/0151366 | A1  | 5/2018  | Endo et al. |

FOREIGN PATENT DOCUMENTS

| WO | 2018/008527 A1 | 1/2018 |
| WO | 2018/008529 A1 | 1/2018 |
| WO | 2018/008528 A1 | 11/2018 |

* cited by examiner

SILICON CARBIDE SEMICONDUCTOR DEVICE AND MANUFACTURING METHOD THEREFOR

CROSS REFERENCE TO RELATED APPLICATIONS

This application is a U.S. national phase of International Application No. PCT/JP2017/023987 filed on Jun. 29, 2017 and is based on Japanese Patent Application No. 2016-133673 filed on Jul. 5, 2016, the disclosure of which is incorporated herein by reference.

TECHNICAL FIELD

The present disclosure relates to a silicon carbide (hereinafter referred to as SiC) semiconductor device having a deep layer and a guard ring layer and a method of manufacturing the same.

BACKGROUND

Conventionally, SiC has attracted attention as a material of power devices that can obtain high electric field breakdown strength. As a power device of SiC, for example, a MOSFET, a Schottky diode and the like have been proposed (see, for example, Patent Literature 1).

A power device made of SiC includes a cell portion in which a power element such as a MOSFET or a Schottky diode is formed and a guard ring portion surrounding the periphery of the cell portion. Between the cell portion and the guard ring portion, a connecting portion for connecting the cell portion and the guard ring portion is provided, and electrode pads, for example, are arranged on the surface side of the semiconductor substrate in the connection portion. Then, in the outer peripheral region including the guard ring portion, by concaving the surface of the semiconductor substrate to provide a concave portion, the cell portion and the connection portion are formed into a mesa portion which protrudes like islands.

PRIOR ART LITERATURES

Patent Literature

Patent Literature 1: JP-2011-101036-A

SUMMARY

As described above, in the case where the connection portion is arranged between the cell portion and the guard ring portion, the concave portion is formed in the outer peripheral region including the guard ring portion, and the mesa portion is prepared by protruding the cell portion and the connection portion in an island shape, it is conceivable to form the deep layer, the connection layer and the like by an epitaxial film. However, in such a configuration, it has been confirmed that there is a possibility that the withstand voltage required for the power device may not be obtained.

It is an object of the present disclosure to provide a SiC semiconductor device and a manufacturing method of the SiC semiconductor device provided with a semiconductor element capable of ensuring a withstand voltage even when a deep layer, a connection layer or the like is made of an epitaxial film.

According to an aspect of the present disclosure, a SiC semiconductor device includes a substrate with a first or second conductivity type and a drift layer with a first conductivity type arranged on the front surface side of the substrate and having a lower impurity concentration than the substrate. In addition to the cell portion, an outer peripheral portion is formed such that the outer peripheral portion includes a guard ring portion surrounding the outer periphery of the cell portion and a connection portion located between the guard ring portion and the cell portion. In the cell portion or the cell portion and the connection portion, a second conductivity type layer is arranged such that the second conductivity type layer is disposed in a plurality of line-shaped first trenches formed in the drift layer with a stripe shape, and is made of an epitaxial film having the second conductivity type. Further, in the cell portion, a vertical type semiconductor device for flowing current between a first electrode and a second electrode is arranged, and includes the first electrode electrically connected to the second conductivity type layer and the second electrode formed on the back side of the substrate. The guard ring portion or the guard ring portion and the connecting portion includes a second conductivity type ring, which is disposed in a line-shaped second trench formed from the surface of the drift layer and has a plurality of frame shapes surrounding the cell portion, and is made of an epitaxial film. In such a structure, the tip of the second conductivity type layer includes an extension region which is made of an epitaxial film having a second conductivity type, is connected to the front end of the first trench, protrudes only in the direction toward the adjacent second conductivity type layer out of the plurality of second conductivity type layers, and is disposed in a linear expansion trench formed so as to be spaced away from the adjacent second conductive type layer.

In this way, the extension region is connected to the tip of the second conductivity type layer. Since such an extension region is formed, it is possible to eliminate a region where the distance between the second conductivity type layer and the second conductivity type ring increases. Therefore, it is possible to prevent the equipotential line from being excessively raised.

In addition, when it is only necessary to eliminate the region where the distance between the second conductivity type layer and the second conductivity type ring becomes large, instead of providing the extension region, the second conductivity type layer may be formed to directly connect to the second conductivity type ring. However, a portion of the connecting part therebetween where the width becomes large may be generated, and the thickness of the second conductivity type layer may become thin at that portion. In this case, a desired withstand voltage cannot be obtained.

Therefore, by adopting a structure in which the extension region is extended so as to extend in one direction from the tip of the second conductivity type layer, it is possible to prevent the occurrence of a portion of the connecting part between the extension region and the second conductivity type layer from being generated, the portion having a large width. As a result, occurrence of a difficulty such as a reduction in the thickness of the second conductivity type layer at the connecting part can be suppressed, and a desired withstand voltage can be secured.

EMBODIMENTS

Figure 1:
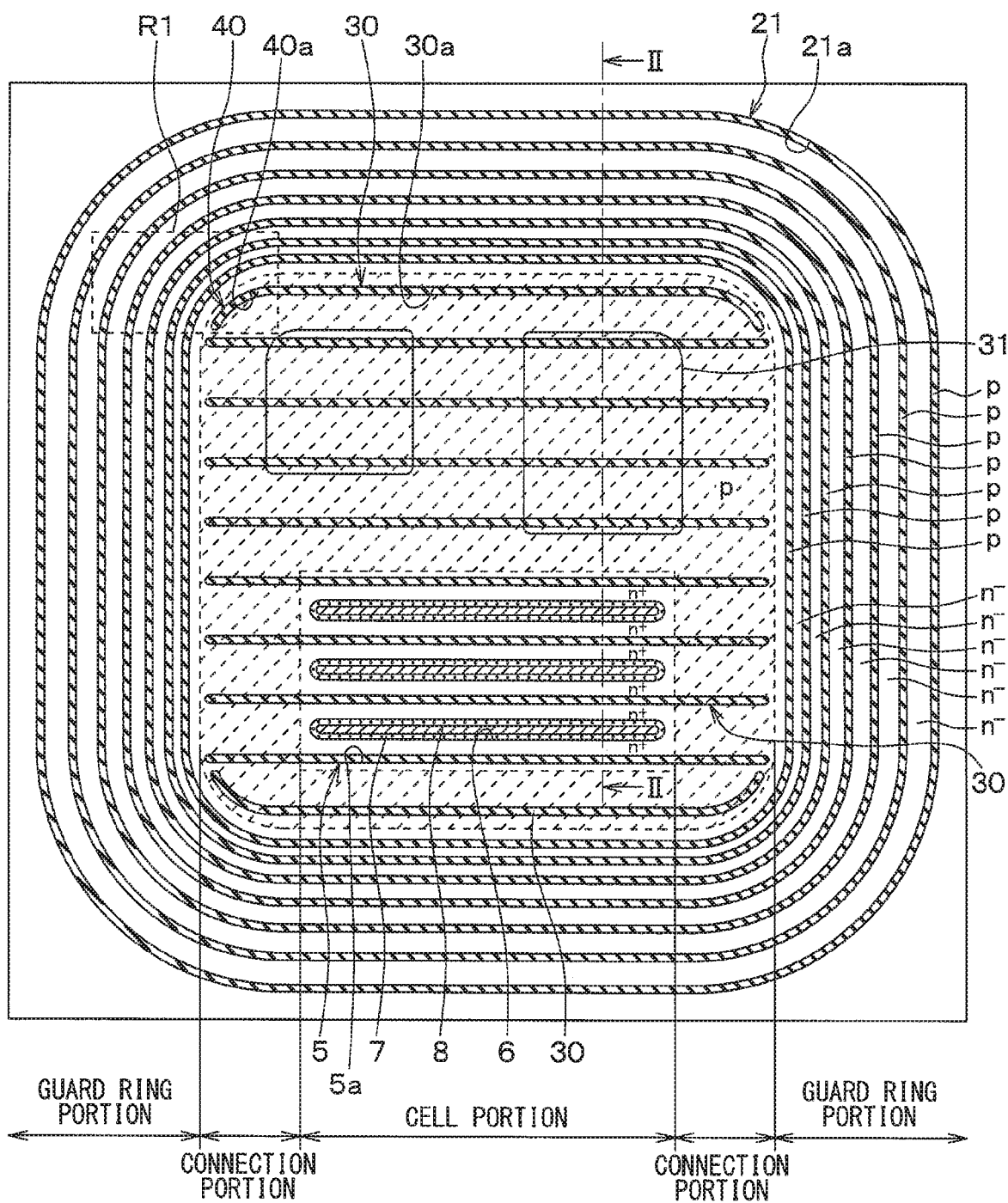
FIG. 1 is a diagram schematically showing a top layout of a SiC semiconductor device according to a first embodiment.

Hereinafter, embodiments of the present disclosure will be described with reference to the drawings. In the following embodiments, the same or equivalent parts are denoted by the same reference numerals.

First Embodiment

A first embodiment will be described. Here, an SiC semiconductor device in which an inversion type MOSFET having a trench gate structure is formed as a power element providing a semiconductor element will be described as an example.

The SiC semiconductor device shown in FIG. 1 has a cell portion in which a MOSFET having a trench gate structure is formed, and an outer peripheral portion surrounding the cell portion. The outer peripheral portion has a guard ring portion and a connection portion disposed inside the guard ring portion, that is, between the cell portion and the guard ring portion. Although FIG. 1 is not a cross-sectional view, hatching is partially shown in order to make the figure easy understandable.

Figure 2:
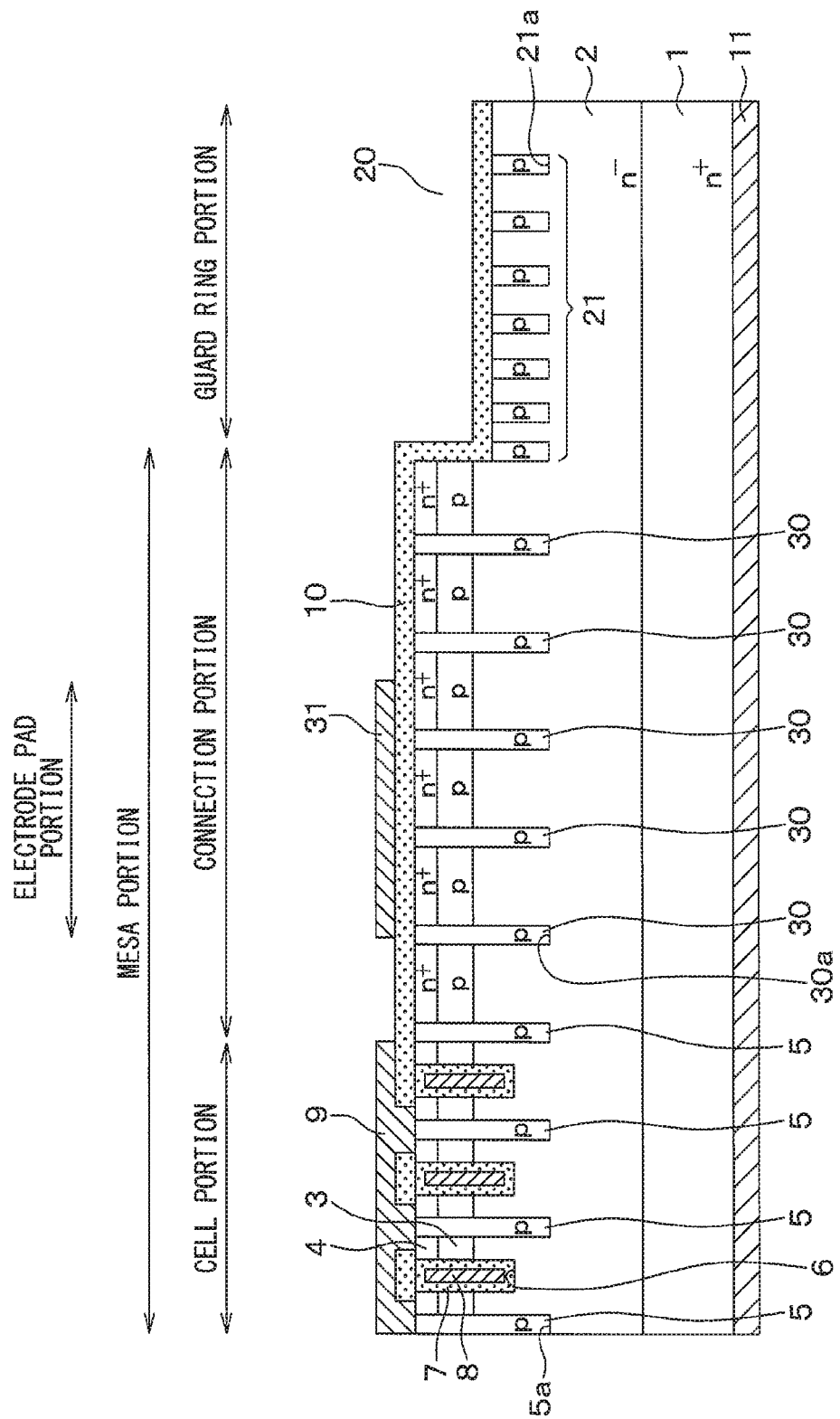
FIG. 2 is a diagram showing a cross-sectional view taken along line II-II of FIG. 1.

As shown in FIG. 2, the SiC semiconductor device is formed using an $n^+$ type substrate 1 made of SiC. On the main surface of the $n^+$ type substrate 1, an $n^-$ type drift layer 2, a p type base region 3, and the $n^+$ type source region 4 are made of SiC and are sequentially epitaxially grown.

For example, the $n^+$ type substrate 1 has an n type impurity concentration of $1.0 \times 10^{19}/cm^3$, and its surface is a (0001) Si plane. The $n^-$ type drift layer 2 has, for example, an n type impurity concentration of $0.5 \times 10^{16}/cm^3$ to $2.0 \times 10^{16}/cm^3$.

Further, the p type base region 3 has a portion where a channel region is formed, and the portion has the p type impurity concentration of, for example, about $2.0 \times 10^{17}/cm^3$ and the thickness of 300 nm. The $n^+$ type source region 4 has a higher impurity concentration than the $n^-$ type drift layer 2, and has the n type impurity concentration in the surface portion of, for example, $2.5 \times 10^{18}/cm^3$ to $1.0 \times 10^{19}/cm^3$, and the thickness of about 0.5 μm.

In the cell portion, the p type base region 3 and the $n^+$ type source region 4 are left on the surface side of the $n^+$ type substrate 1, and in the guard ring portion, the concave portion 20 is formed to penetrate the $n^+$ type source region 4 and the p type base region 3 and to reach the $n^-$ type drift layer 2. By adopting such a structure, a mesa structure is formed.

In the cell portion, a p type deep layer 5 is formed so as to penetrate the $n^+$ type source region 4 and the p type base region 3 and to reach the $n^-$ type drift layer 2. The p type deep layer 5 has a higher p type impurity concentration than the p type base region 3. More specifically, a plurality of p type deep layers 5 are arranged at equal intervals at least in the $n^-$ type drift layer 2, and the p type deep layers 5 are arranged in the stripe-shaped trenches 5a which are separated from each other without intersecting each other, and is made of a p type epitaxial film in an epitaxial growth process. The trench 5a corresponds to a deep trench, and has a depth of, for example, 1 micrometer or less and an aspect ratio of 2 or more.

For example, each p type deep layer 5 has a p type impurity concentration of, for example, $1.0 \times 10^{17}/cm^3$ to $1.0 \times 10^{19}/cm^3$, a width of 0.7 micro-meters, and a depth of about 2.0 micro meters. The p type deep layer 5 is formed from one end to the other end of the cell portion as shown in FIG. 1. Further, the p type deep layer 5 extends along a longitudinal direction same as the extending direction of the trench gate structure to be described later, and is connected to a p type connection layer 30, which will be described later, extending further to the outside of the cell portion than both ends of the trench gate structure.

Although the extending direction of the p type deep layer 5 may be arbitrary, both walls of the trench 5a, which face each other, provide a long side of the trench 5a, and extend in the <11-20> direction, are the same (1-100) plane. Thus, the growth at the embedding and epitaxial growth process is homogeneous on both wall surfaces. Therefore, the film quality can be made uniform and the effect of suppressing the embedding failure can also be obtained.

A gate trench 6 having a width of 0.8 μm and a depth of 1.0 μm, for example, is formed so as to penetrate the p type base region 3 and the n$^+$ type source region 4 and to reach the n$^-$ type drift layer 2. The above described p type base region 3 and n$^+$ type source region 4 are arranged so as to be in contact with the side surface of the gate trench 6. The gate trench 6 is formed in a line-like layout in which the lateral direction of the drawing surface of FIG. 2 is the width direction, the direction perpendicular to the drawing surface is the longitudinal direction, and the vertical direction of the drawing surface is the depth direction. In addition, as shown in FIG. 1, a plurality of gate trenches 6 are arranged so as to be sandwiched between p type deep layers 5, respectively, and are arranged in a stripe shape manner in parallel to each other at equal intervals.

A portion of the p type base region 3 located on the side surface of the gate trench 6 functions as a channel region connecting between the n$^+$ type source region 4 and the n$^-$ type drift layer 2 during the operation of the vertical MOSFET. A gate insulation film 7 is formed on the inner wall surface of the gate trench 6 including the channel region. A gate electrode 8 made of doped Poly-Si is formed on the surface of the gate insulation film 7, and the inside of the gate trench 6 is filled with the gate insulation film 7 and the gate electrode 8.

On the surfaces of the n$^+$ type source region 4 and the p type deep layer 5, and on the surface of the gate electrode 8, a source electrode 9 corresponding to the first electrode and a gate pad 31 arranged in an electrode pad portion are formed. The source electrode 9 and the gate pad 31 are made of a plurality of metals, for example, Ni/Al or the like. A portion of at least n type SiC among a plurality of metals, specifically, a portion in contact with the gate electrode 8 in the case of the n$^+$ type source region 4 or the n type doping portion, is made of a metal capable of ohmic contact with the n type SiC. In addition, at least a portion of at least p type SiC among the plurality of metals, specifically, a portion in contact with the p type deep layer 5, is made of a metal capable of ohmic contact with the p type SiC. Here, the source electrode 9 and the gate pad 31 are formed on the interlayer insulation film 10 to be electrically insulated. Then, through the contact hole formed in the interlayer insulation film 10, the source electrode 9 is electrically connected to the n$^+$ type source region 4 and the p type deep layer 5, and the gate pad 31 is electrically connected to the gate electrode 8.

Further, a drain electrode 11 corresponding to a second electrode electrically connected to the n$^+$ type substrate 1 is formed on the back side of the n$^+$ type substrate 1. With such a structure, an n channel inversion type trench gate structure MOSFET is provided. Then, a plurality of such MOSFETs are arranged in a plurality of cells respectively to form a cell portion.

On the other hand, in the guard ring portion, as described above, the concave portion 20 is formed so as to penetrate the n$^+$ type source region 4 and the p type base region 3 and to reach the n$^-$ type drift layer 2. Therefore, the n$^+$ type source region 4 and the p type base region 3 are removed at a position distant from the cell portion, and the n$^-$ type drift layer 2 is exposed. In the thickness direction of the n$^+$ type substrate 1, a cell portion and a connecting portion located inside the concave portion 20 are mesa portions protruding like islands.

A plurality of p type guard rings 21 are arranged on the surface layer portion of the n$^-$ type drift layer 2 located below the concave portion 20 so as to surround the cell portion. In FIG. 1, seven p type guard rings 21 are shown. In the case of the present embodiment, the p type guard ring 21 has a quadrangular shape in which the four corners are rounded. Alternatively, the ring 21 may have another frame shape such as a circular shape. The p type guard ring 21 is disposed in the trench 21a, which penetrates the n$^+$ type source region 4 and the p type base region 3 and reaches the n$^-$ type drift layer 2, and is made of a p type epitaxial film by epitaxial growth. The trench 21a corresponds to a guard ring trench, and has a depth of, for example, 1 micrometer or less and an aspect ratio of 2 or more.

Each part constituting the p type guard ring 21 has the same structure as the above described p type deep layer 5. The p type guard ring 21 is different from the p type deep layer 5 formed in a straight line shape about a feature such that the top surface shape a line shape having a frame surrounding the cell portion and the connection portion. But the other features are similar. Thus, the p type guard ring 21 has the same width and the same thickness as the p type deep layer 5, that is, the same depth. The intervals between the p type guard rings 21 may be equal to each other. Alternatively, the intervals between the guard rings 21 may be narrower at the side of the cell portion and wider toward the outer peripheral side, so that the electric field concentration is relaxed more on the inner circumferential side, that is, on the cell portion side, and the equipotential line directs to more outer peripheral side.

Although not shown, the EQR structure is arranged on the outer periphery of the p type guard ring 21 as necessary, so that a guard ring portion having an outer peripheral withstand voltage structure surrounding the cell portion is provided.

Furthermore, a plurality of p type connection layers 30 are formed in the surface layer portion of the n$^-$ type drift layer 2 at the connection portion, provided by a portion extending from the cell portion to the guard ring portion as the connection portion. In the case of the present embodiment, as shown by dashed hatching lines in FIG. 1, a connection portion is formed so as to surround the cell portion, and furthermore, multiple p type guard rings 21 having a rectangular shape with four rounded corners are formed so as to surround the outside of the connection portion. A plurality of the p type connection layers 30 are arranged in parallel with the p type deep layer 5 formed in the cell portion, and in the present embodiment, the p type connection layers 30 are arranged at equal intervals, which is equal to the interval between the adjacent p type deep layers 5. Further, in a place where the distance from the cell portion to the p type guard ring 21 is long, the p type connection layer 30 extends from the p type deep layer 5, and the distance from the p type connection layer 30 to the p type guard ring 21 is shortened.

Each p type connection layer 30 is disposed in the trench 30a, which penetrates the n$^+$ type source region 4 and the p type base region 3 and reaches the n type drift layer 2, and is made of a p type epitaxial film by epitaxial growth. Between the cell portion and the guard ring portion in the longitudinal direction of the p type deep layer 5, the p type connection layer 30 is formed so as to connect to the tip of the p type deep layer 5. The trench 30a corresponds to a connection trench, and has a depth of, for example, 1 micrometer or less and an aspect ratio of 2 or more. Since the p type connection layer 30 is in contact with the p type base region 3, the potential of the p type connection layer 30 is fixed at the source potential.

Each part constituting the p type connection layer 30 has the same structure as the p type deep layer 5 and the p type guard ring 21, described above. The feature such that the upper surface shape of the p type connection layer 30 is a linear shape is different from the p type guard ring 21 formed in a frame shape, but the other features are the same. That is, the p type connection layer 30 has the same width and the same thickness, i.e., the same depth as the p type deep layer 5 and the guard ring 21. In the present embodiment, the interval between the p type connection layers 30 is equal to the interval between the p type deep layers 5 in the cell portion. Alternatively, the interval may be different from the interval between the p type deep layers 5.

By forming such a p type connection layer 30, and setting the distance between the p type connection layers 30 to be a predetermined distance, for example, to be equal to or less than the interval between the p type deep layers 5, it is possible to suppress the equipotential line from excessively rising up in a region between the p type connection layers 30. Thereby, it is possible to suppress the formation of a portion where the electric field concentration occurs between the p type connection layers 30, and it is possible to suppress the reduction in breakdown voltage.

In addition, at the both ends of each p type connection layer 30 in the longitudinal direction, that is, at both ends of the trench 30a, the top surface shape of the p type connection layer 30 is a semicircular shape. The shape of the upper surface at both ends of the trench 30a may be a quadrangular shape. Alternatively, n type layer may be firstly formed at the corner portion, so that the conductive type becomes the n type. Therefore, by forming the upper surface shape of both ends of the p type connection layer 30 to have a semicircular shape, it is possible to eliminate the portion where the n type layer is formed.

Also in the connection portion, the interlayer insulating film 10 is formed on the surface of the n⁺ type source region 4. The gate pad 31 described above is formed on the interlayer insulation film 10 at the connection portion.

In this way, since the connection portion is arranged between the cell portion and the guard ring portion, and the connection portion is constituted by the plurality of p type connection layers 30 buried in the narrow trench 30a, the thickness of the p type connection layer 30 is not reduced and the p type connection layer 30 is not eliminated. On the other hand, since the p type connection layer 30 is divided into a plurality of parts, there is a possibility that equipotential lines will rise up between the p type connection layers 30. However, by setting the interval between the p type connection layers 30 to be a predetermined interval, for example, to be equal to or less than the interval between the p-type deep layers 5, excessive rising of the equipotential line can be suppressed, and reduction in breakdown voltage can be suppressed.

Figure 3:
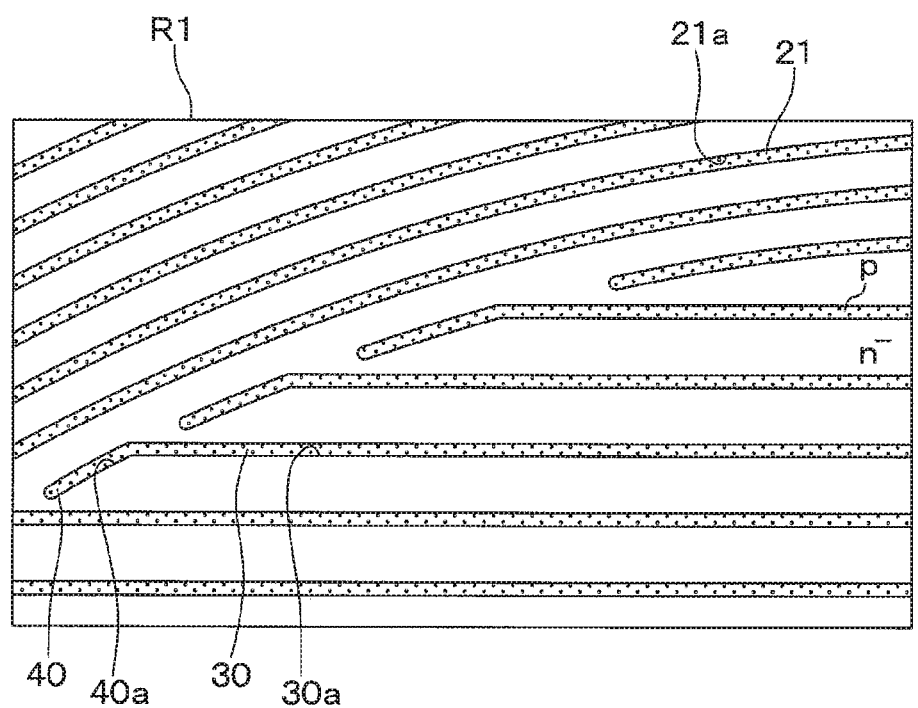
FIG. 3 is a partial enlarged view of a region R1 in FIG. 2.
Figure 6:
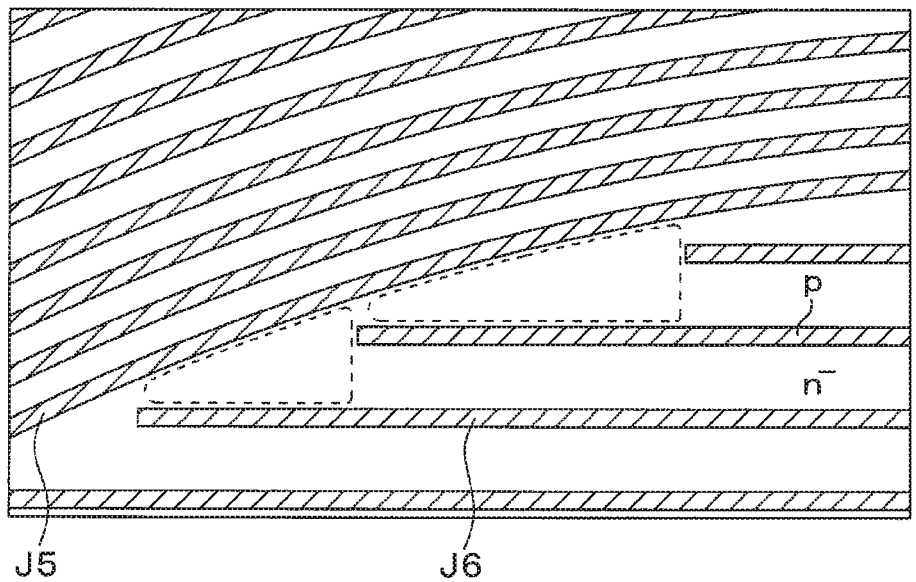
FIG. 6 is a partial enlarged view of a top layout of a SiC semiconductor device studied by the present inventors.

However, if the plurality of p type connection layers 30 is merely formed to have a narrow width, there may be a place where the interval between the p type connection layer J6 and the p type guard ring J5 becomes large as shown in FIG. 6, which is to be described later. Therefore, in the present embodiment, as shown in FIGS. 1 and 3, the p type extension region 40 is connected to the tip portion of the p type connection layer 30.

The p type extension region 40 is formed so as to protrude to the inside of a place where the distance between both the tips of the p type connection layer 30 and the p type guard ring 21 on the innermost peripheral side becomes large, and the p type extension region 40 is arranged so as to be spaced apart from the adjacent p type connection layer 30 without connecting to the adjacent p type connection layer 30. Specifically, as shown in FIG. 1, the p type guard ring 21 has a rectangular shape with four corners having an arc shape. A place, where the distance between the p type connection layer 30 and the p type guard ring 21 becomes large at a position in the connection portion corresponding to the arc shape of the p guard ring 21, may be created. Therefore, the p type extension region 40 is connected to the front end portion of the p type connection layer 30 at a position corresponding to the arc shape portion of the p type guard ring 21. Each p type extension region 40 is disposed in the trench 40a, which penetrates the n⁺ type source region 4 and the p type base region 3 and reaches the n⁻ type drift layer 2, and is made of a p type epitaxial film by epitaxial growth. The trench 40a corresponds to an extension trench, and has a depth of, for example, 1 micrometer or less and an aspect ratio of 2 or more.

Although the length of the p type extension region 40, that is, the amount of protrusion from the tip of the p type connection layer 30 may be any length. The closest distance from the tip (hereinafter, this tip is referred to as the tip of the p type extended region 40) position to the closest p type connection layer 30 is made smaller than the interval between the adjacent p type connection layers 30, the tip of the p type extension region 40 being opposite to the side of the p type extension region 40 which is connected to the p type connection layer 30. In addition, the closest distance from the tip of the p type extension region 40 to the adjacent p type connection layer 30 or the p type guard ring 21 is set to be equal to or less than twice the amount of extension of the depletion layer extending from the p type connection layer 30 to the n⁻ type drift layer 2 according to the built-in potential of SiC when no bias is applied. Specifically, the closest distance is equal to or less than 1.4 µm.

In addition, the p type extension region 40 has a structure such that the p type extension region 40 extends from the tip position of the p type connection layer 30 toward the tip position of the p type connection layer 30 located next thereto, and in the present embodiment, the p type extension region 40 has an arc shape corresponding to the arc shape portion of the p type guard ring 21. Further, at the front end of the p type extension region 40 in the longitudinal direction, that is, at the front end of the trench 40a, the upper surface shape of the p type extension region 40 is a semicircular shape. Therefore, it is possible to suppress the corner portion from becoming a n type portion as in the case of forming the top shape of the tip of the trench 40a into a rectangular shape.

With the above structure, the SiC semiconductor device according to the present embodiment is configured. In the SiC semiconductor device configured as described above, when the MOSFET turns on, by controlling the voltage applied to the gate electrode 8, a channel region is formed in the surface portion of the p type base region 3 located on the side surface of the gate trench 6. Thus, a current flows between the source electrode 9 and the drain electrode 11 via the n⁺ type source region 4 and the n type drift layer 2.

In addition, even when a high voltage is applied at the time the MOSFET turns off, since the p type deep layer 5 is formed to a deeper position than the trench gate structure, entry of an electric field to the bottom of the gate trench is suppressed by the p type deep layer 5, so that the electric field concentration at the bottom of the gate trench is reduced. As a result, breakdown of the gate insulation film 7 is prevented.

In the connection portion, the rising of the equipotential line is suppressed, and the equipotential line is directed toward the guard ring portion side. Particularly, as described above, since the p type extended region 40 is formed, it becomes possible to eliminate the region where the interval becomes large between the p type connection layer 30 and the p type guard ring 21, and it is possible to restrict the equipotential line from excessively rising.

Further, in the guard ring portion, the p type guard ring 21 terminates the interval between the equipotential lines while expanding the interval toward the outer circumference direction, so that a required withstand voltage can be obtained even in the guard ring portion. Therefore, a SiC semiconductor device capable of obtaining a required breakdown voltage can be obtained.

Subsequently, a method of manufacturing the SiC semiconductor device according to this embodiment will be described with reference to FIG. 4A to FIG. 4H.

Figure 4A:
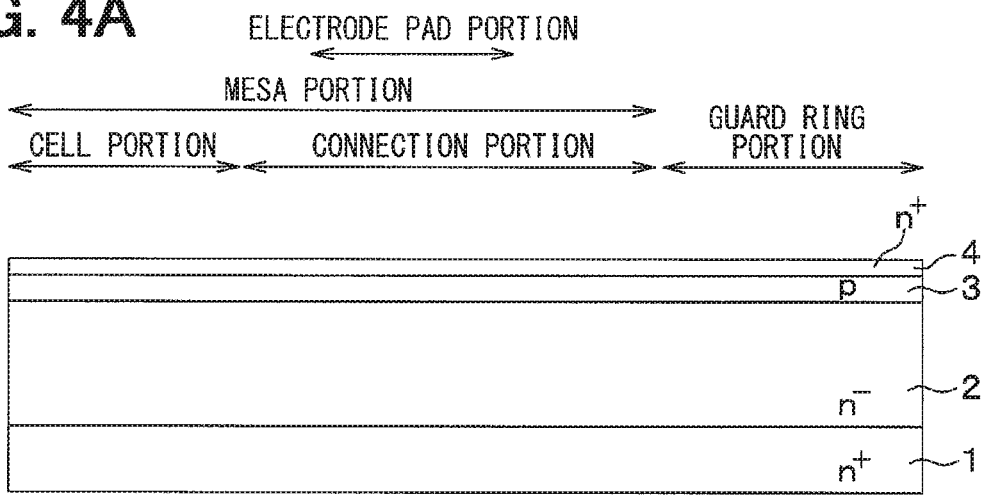
FIG. 4A is a cross-sectional view showing a manufacturing process of a SiC semiconductor device according to the first embodiment.

[Process Shown in FIG. 4A]

First, an n$^+$ type substrate 1 is prepared as a semiconductor substrate. Then, an n$^-$ type drift layer 2, a p type base region 3 and an n$^+$ type source region 4 made of SiC are epitaxially grown in this order on the main surface of the n$^+$ type substrate 1.

Figure 4B:
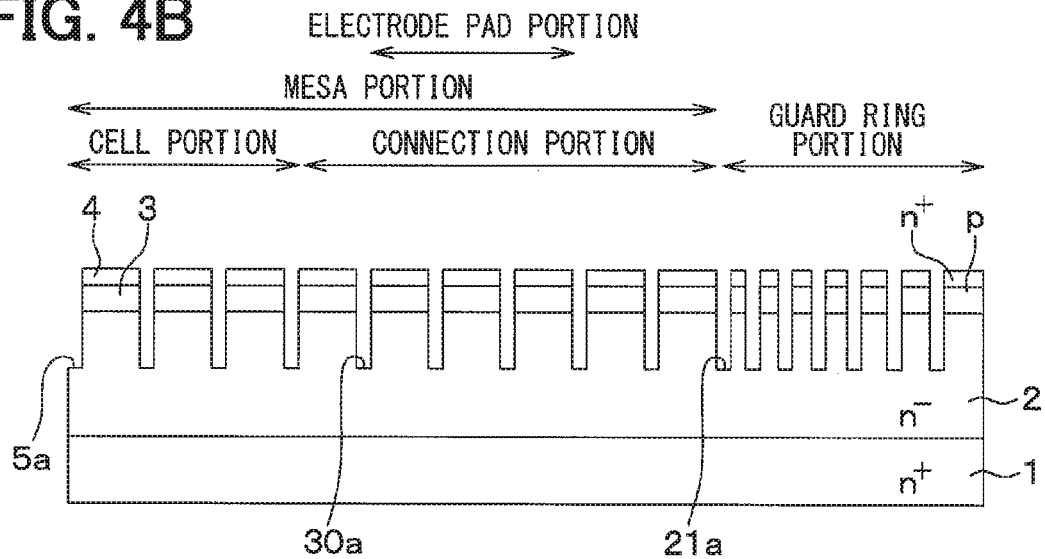
FIG. 4B is a cross-sectional view showing a manufacturing process of the SiC semiconductor device continued from FIG. 4A.

[Process Shown in FIG. 4B]

Next, a mask not shown is placed on the surface of the n$^+$ type source region 4, and a region of the mask where the p type deep layer 5, the p type guard ring 21, the p type connection layer 30 and the p type extension region 40 are to be formed is opened. Then, anisotropic etching such as RIE (Reactive Ion Etching) is performed using a mask to form the trenches 5a, 21a, and 30a, and to form a trench 40a in a cross section different from FIG. 4B.

Figure 4C:
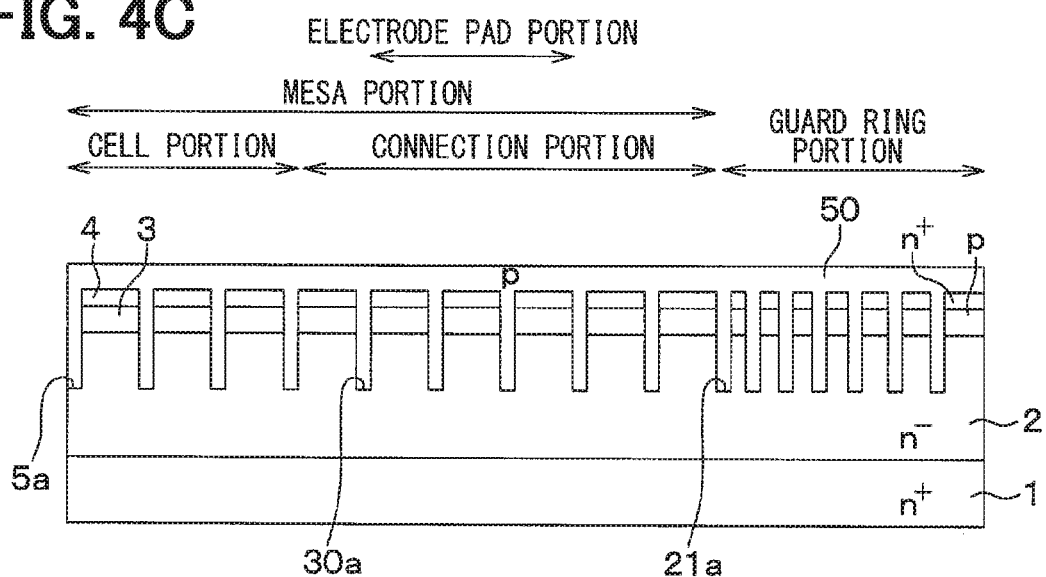
FIG. 4C is a cross-sectional view showing a manufacturing process of the SiC semiconductor device continued from FIG. 4B.

[Process Shown in FIG. 4C]

After removing the mask, the p type layer 50 is formed. At this time, the p type layer 50 is buried in the trenches 5a, 21a, 30a, 40a by the buried epitaxial process. However, since the trenches 5a, 21a, 30a, 40a are formed with the same width, it is possible to suppress occurrence of shape abnormality or unevenness on the surface of the p type layer 50. Therefore, the p type layer 50 can be reliably buried in each of the trenches 5a, 21a, 30a, and 40a, and the surface of the p type layer 50 has a flat shape with little unevenness.

Figure 4D:
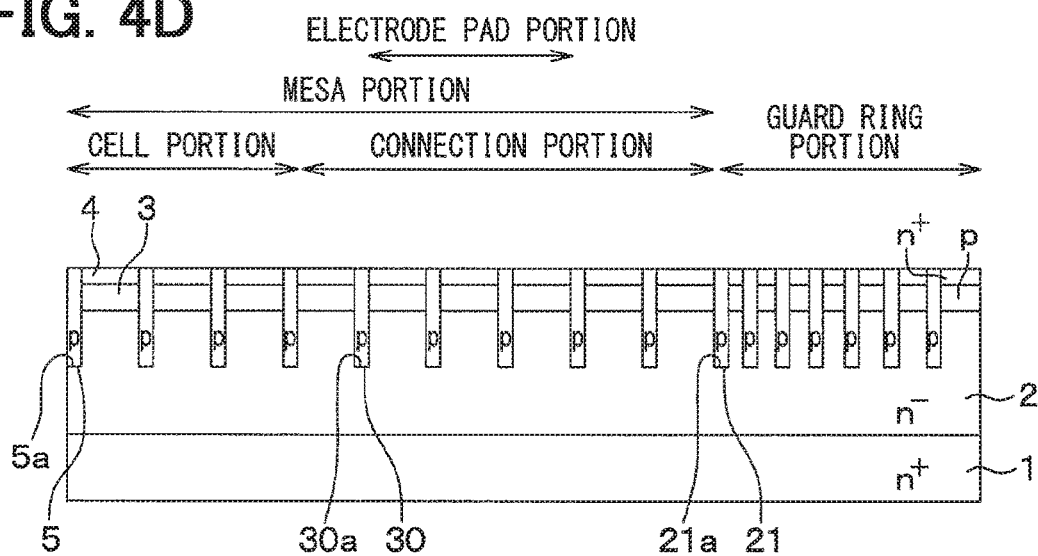
FIG. 4D is a cross-sectional view showing a manufacturing process of the SiC semiconductor device continued from FIG. 4C.

[Process Shown in FIG. 4D]

An etch back process is performed by the dry etching method to remove a part of the p type layer 50 formed above the surface of the n$^+$ type source region 4. Thereby, the p type deep layer 5, the p type guard ring 21, the p type connection layer 30 and the p type extension region 40 are formed. At this time, as described above, since the surface of the p type layer 50 has a flat shape with little unevenness, the p type deep layer 5, the p type guard ring 21, the p type connection layer 30 and the p type extension region 40 are flattened. Therefore, when various processes for forming a trench gate structure are performed thereafter, a desired gate shape can be obtained. In addition, since the p type layer 50 is reliably buried in each of the trenches 5a, 21a, 30a, and 40a, no difficulty such as thinning of the thickness of the p type connection layer 30 occurs.

Figure 4E:
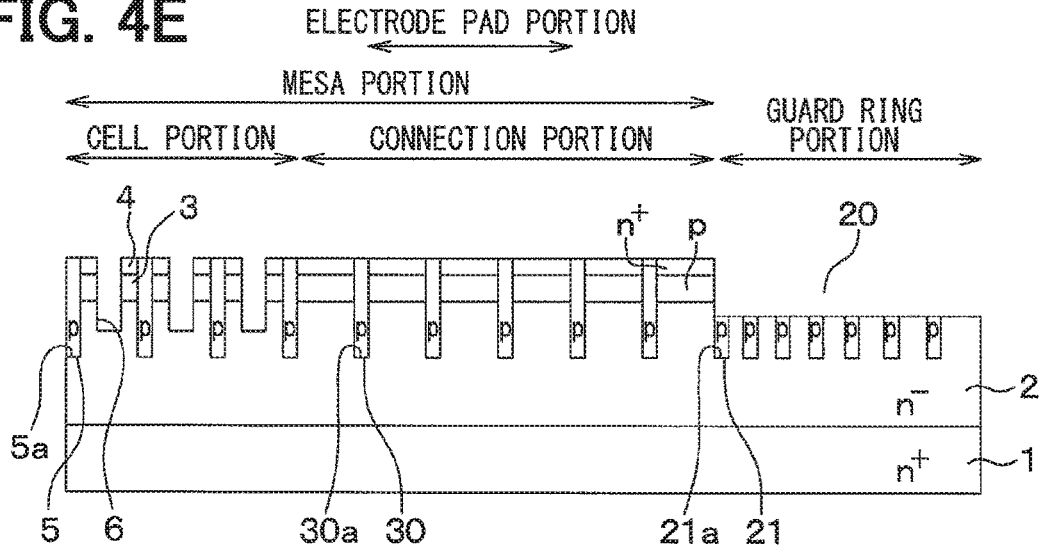
FIG. 4E is a cross-sectional view showing a manufacturing process of the SiC semiconductor device continued from FIG. 4D.

[Process Shown in FIG. 4E]

A mask not shown is formed on the n$^+$ type source region 4 and the like, and then a region of the mask where the gate trench 6 is to be formed is opened. Then, the gate trench 6 is formed by performing anisotropic etching process such as RIE using a mask.

Further, after removing the mask, a mask not shown is formed again, and an area of the mask in which the concave portion 20 is to be formed is opened. Then, the concave portion 20 is formed by performing an anisotropic etching process such as RIE using a mask. As a result, the n$^-$ type drift layer 2 is exposed through the n$^+$ type source region 4 and the p type base region 3 at the position where the concave portion 20 is formed, and a plurality of the p type guard rings 21 are arranged on the surface portion of the n$^-$ type drift layer 2.

Here, the concave portion 20 of the gate trench 6 is formed in a separate process using different masks. Alternatively, the concave portion 20 may be formed simultaneously using the same mask.

Figure 4F:
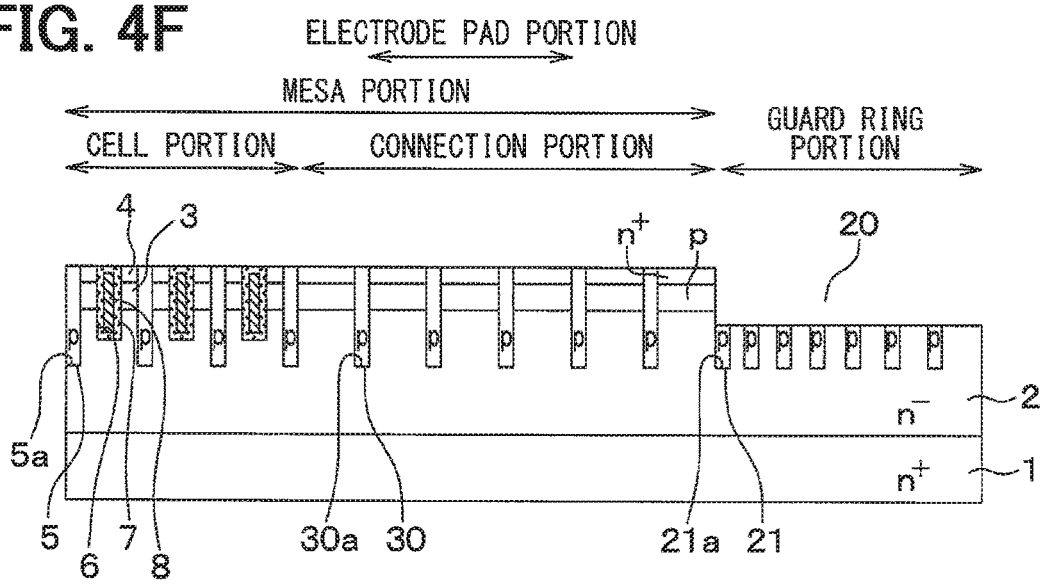
FIG. 4F is a cross-sectional view showing a manufacturing process of the SiC semiconductor device continued from FIG. 4E.

[Process Shown in FIG. 4F]

After removing the mask, for example, thermal oxidation is performed to form the gate insulation film 7, and the gate insulation film 7 covers the inner wall surface of the gate trench 6 and the surface of the n$^+$ type source region 4. Then, after depositing Poly-Si doped with a p type impurity or an n type impurity, the Poly-Si material is etched back to leave the Poly-Si material in at least the gate trench 6, thereby forming the gate electrode 8.

Figure 4G:
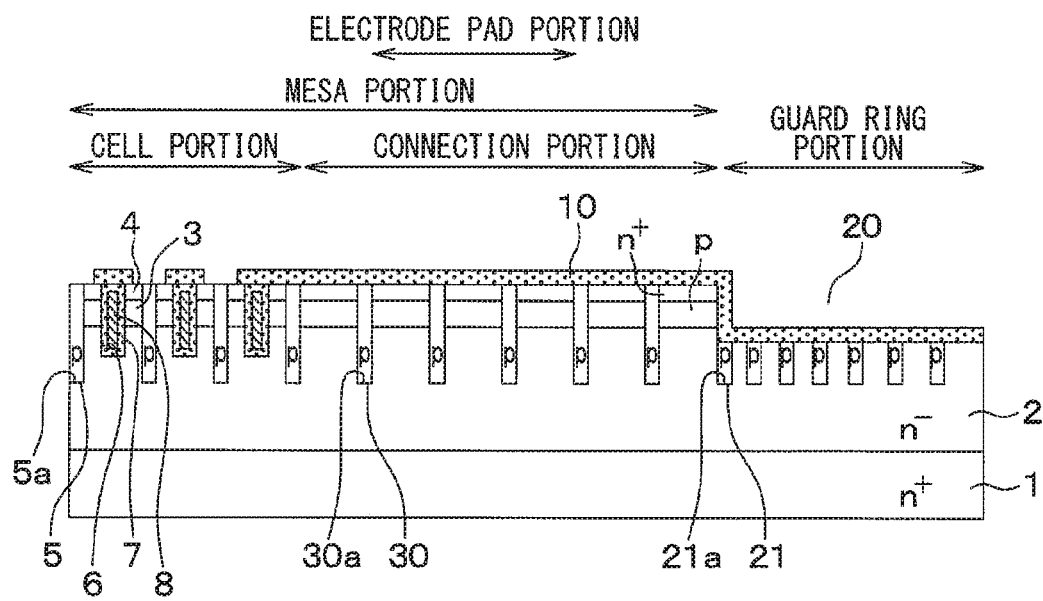
FIG. 4G is a cross-sectional view showing a manufacturing process of the SiC semiconductor device continued from FIG. 4F.

[Process Shown in FIG. 4G]

An interlayer insulation film 10 made of, for example, an oxide film or the like is formed so as to cover the surfaces of the gate electrode 8 and the gate insulation film 7. Then, after forming a mask not shown on the surface of the interlayer insulation film 10, a portion of the mask located between the gate electrodes 8, that is, a portion corresponding to the p type deep layer 5 and their vicinity is opened. Thereafter, a contact hole for exposing the p type deep layer 5 and the n$^+$ type source region 4 is formed by patterning the interlayer insulation film 10 using a mask.

Figure 4H:
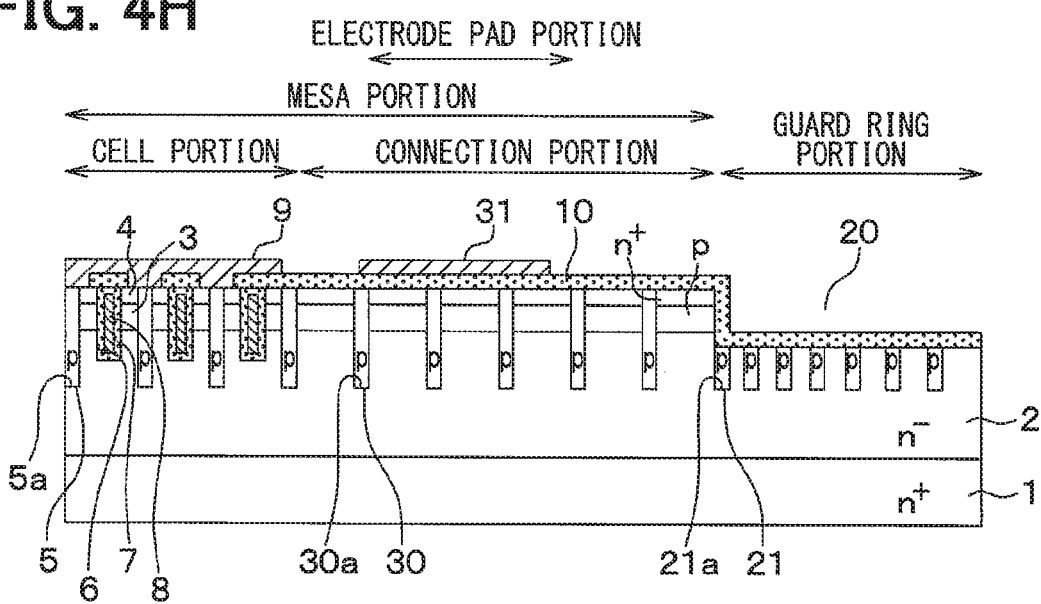
FIG. 4H is a cross-sectional view showing a manufacturing process of the SiC semiconductor device continued from FIG. 4G.

[Step Shown in FIG. 4H]

An electrode material constituted by, for example, a laminated structure of a plurality of metals is formed on the surface of the interlayer insulation film 10. Then, by patterning the electrode material, the source electrode 9 and the gate pad 31 are formed. Here, a gate lead-out portion connected to the gate electrode 8 of each cell is arranged in a cross section different from that in this drawing. A contact hole is formed in the interlayer insulation film 10 at the lead-out portion, so that the gate pad 31 and the gate electrode 8 are electrically connected.

Although not shown in the following process, the SiC semiconductor device according to the present embodiment is completed by performing a process such as forming the drain electrode 11 on the back side of the n$^+$ type substrate 1.

Subsequently, effects of the SiC semiconductor device and the manufacturing method thereof according to the present embodiment will be described.

Before describing the effect, a consideration and the like of the present inventors up to the SiC semiconductor device and the manufacturing method thereof according to this embodiment will be described.

Figure 5:
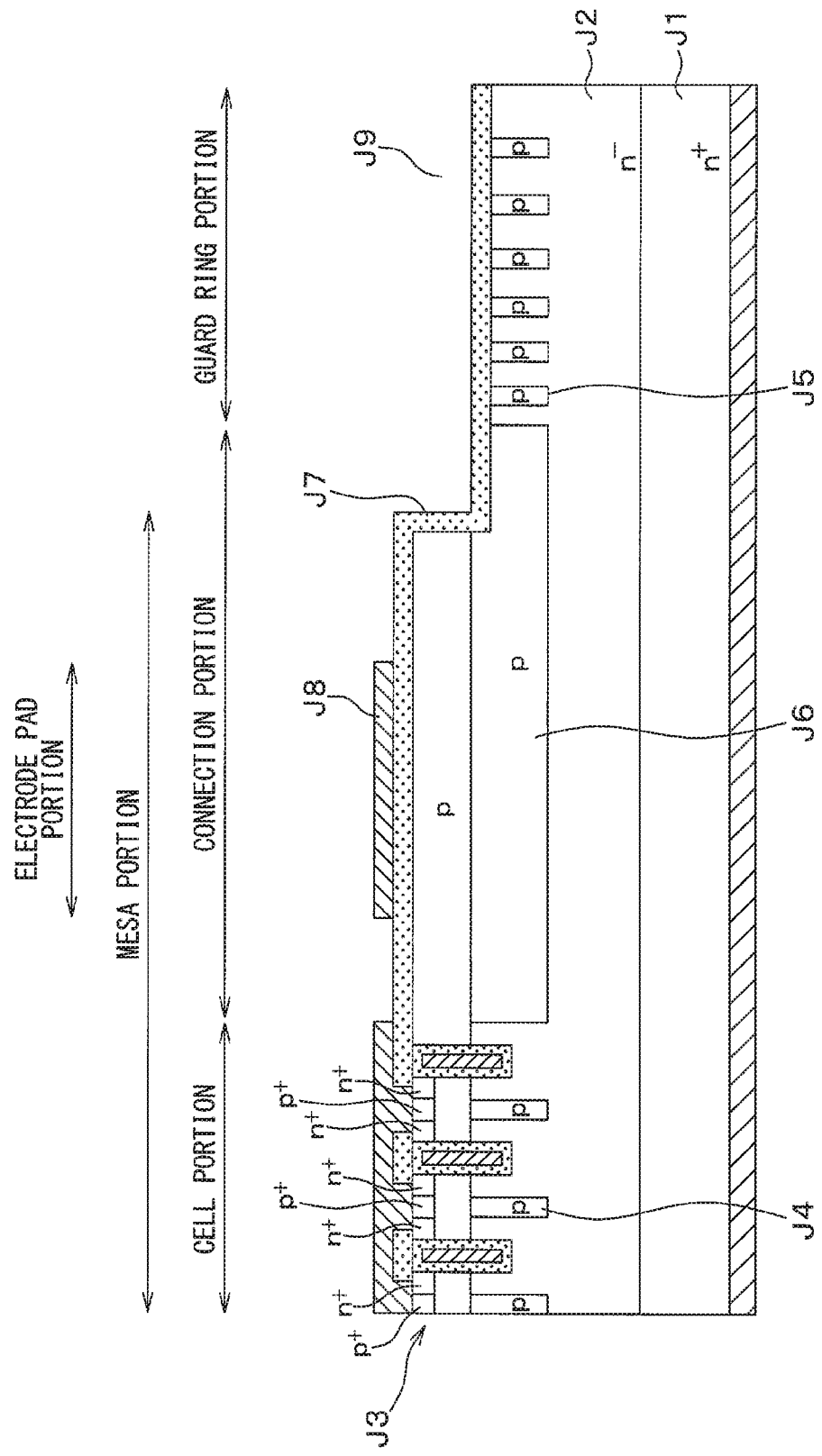
FIG. 5 is a cross-sectional view of a SiC semiconductor device studied by the present inventors.

First, the inventors of the present disclosure consider a structure such that the connection portion is arranged between the cell portion and the guard ring portion, and the concave portion is formed in an outer peripheral region including the guard ring portion, and the mesa portion is provided by protruding the cell portion and the connection portion with an island shape. For example, the structure shown in FIG. 5 is considered.

As shown in the drawing, using a semiconductor substrate in which an n$^-$ type drift layer J2 is formed on an n$^+$ type SiC substrate J1, a cell portion, in which a power element J3 constituted by a MOSFET or the like is formed, and a guard ring portion are formed. A plurality of p type deep layers J4 for improving the withstand voltage of the power device J3 are formed in a stripe shape in the cell portion, and a p type guard ring J5 constituted by a p type layer is formed in the guard ring portion with a frame shape. Then, a connection portion is arranged between the cell portion and the guard ring portion, and a p type connection layer J6 for electric field relaxation is formed in the connection portion so that the equipotential line does not terminate at the connection portion, and the electric field concentration is suppressed. Further, in this connection portion, an electrode pad portion, in which the electrode pad J8 is arranged on the interlayer insulation film J7 formed on the front surface side of the semiconductor substrate, is arranged, and at a desired portion of the power element J3, for example, an electric connection between the gate electrode and an external device is made.

Further, a concave portion J9 is formed in the guard ring portion so that the surface of the n⁻ type drift layer J2 is exposed, and the interlayer insulation film J7 is formed thereon. In the thickness direction of the n⁺ type SiC substrate J1, a mesa portion is prepared by protruding the inner portion of the concave portion J9 from the guard ring portion.

In such a structure, with respect to the p type deep layer J4, the p type connection layer J6 and the p type guard ring J5, a p type impurity is ion implanted in the n⁻ type drift layer J2 so that they are formed.

However, SiC has a short implantation range in the ion implantation process, and therefore, it is difficult to perform the ion implantation to a deep position. In order to form the p type deep layer J4, the p type connection layer J6 and the p type guard ring J5 to a deep position, it is necessary to constitute these by an epitaxial film in the epitaxial growth process rather than the ion implantation process. That is, after embedding the epitaxial film in the trench, the epitaxial film outside the trench is removed by the etch back process to form the p type deep layer J4, the p type connection layer J6 and the p type guard ring J5.

However, in the case of using the epitaxial film, the width of the p type connection layer J6 is larger than the narrow width such as the p type deep layer J4 and the p type guard ring J5, so a difficulty arises such that the thickness of the p type connection layer J6 is thinner, and a region where the p type connection layer J6 is eliminated is formed. For this reason, it was impossible to obtain a withstand voltage required for a power device.

In order to prevent this difficulty, the present inventors investigate to construct the p type connection layer J6 without widening a width but with providing a narrow width having the same width as the p type deep layer J4 and the p type guard ring J5. In this manner, when the width of the p type connection layer J6 is narrowed, occurrence of a region where the p type connection layer J6 is formed thin or the area where the p type connection layer J6 disappears can be suppressed. However, when the p type connection layer J6 or the p type deep layer J4 is connected to the p type guard ring J5, the width is increased at the connection portion therebetween, and the thickness of the p type layer became thin at that connection portion. For this reason, it was impossible to obtain a withstand voltage required for a power device.

Figure 7:
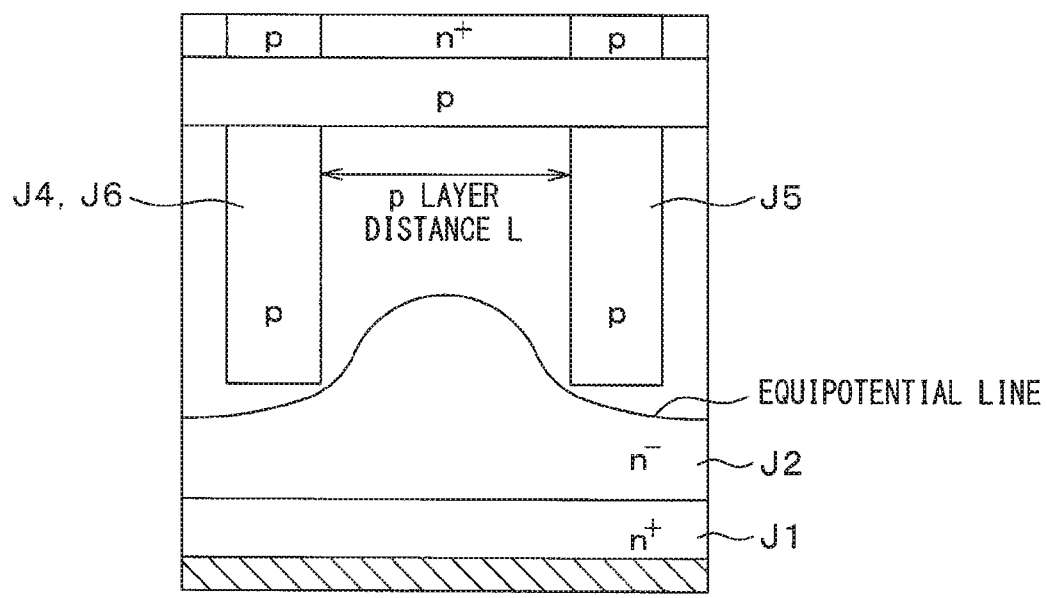
FIG. 7 is a cross-sectional view showing rising of equipotential lines.
Figure 8:
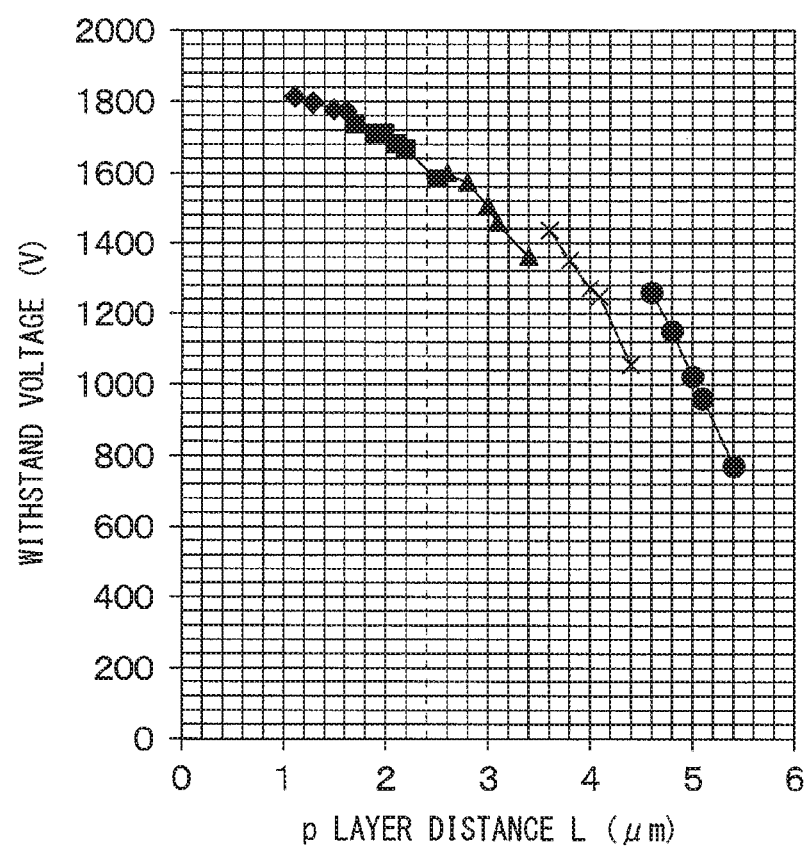
FIG. 8 is a diagram showing the relationship between the intervals between p type deep layers and p type connection layers and the change in the withstand voltage.

Therefore, the inventors of the present invention further investigated a structure that the p type connection layer J6 or the p type deep layer J4 is not connected to the p type guard ring J5. As a result, the difficulty such as thinning of the p type connection layer J6 could be solved. However, since the p type connection layer J6 or the p type deep layer J4 is not connected to the p type guard ring J5, in the vicinity of the boundary position between the p type connection layer J6 or the p type deep layer J4 and the p type guard ring J5, as shown by a broken line in FIG. 6, there occurs a place where the interval increases. In this place, as shown in FIG. 7, excessive rising of the equipotential line occurs between the p type connection layer J6 or the p type deep layer J4 and the p type guard ring J5, so that a desired withstand voltage may not be obtained. According to the simulation, as shown in FIG. 8, as the p layer interval L of the p type deep layers J4 and the p type connection layers J6 increases, the withstand voltage drops, and in order to obtain a breakdown voltage of, for example, 800 V or more, it is necessary to set the p type layer interval to be equal to or less than 2.4 µm.

Therefore, in the present embodiment, the p type extension region 40 is connected to the tip of the p type connection layer 30. Since such a p type extension region 40 is formed, it is possible to eliminate the region where the interval becomes large between the p type connection layer 30 and the p type guard ring 21 in the entire region of the mesa portion. That is, the closest distance between the p type layers such as the p type deep layers 5, the p type connection layers 30, the p type extension regions 40 and the like in the entire region of the mesa portion, is set to be shorter than the interval of the p type deep layers 5. For this reason, it is possible to prevent the equipotential line from excessively rising up in the entire area of the mesa portion.

In addition, when merely eliminating the region where the interval is large between the p type connection layer 30 and the p type guard ring 21, instead of providing the p type extension region 40, the p type connection layer 30 may be directly connected to the p-type guard ring 21. However, a portion of the connecting part therebetween where the width becomes large may be generated, and the thickness of the p type layer may become thin at that portion. In this case, it becomes impossible to obtain the withstand voltage required for the power device.

Therefore, as in the present embodiment, by adopting a structure in which the p type extension region 40 extends in one direction from the tip of the p type connection layer 30, it is possible to prevent a place having the large width from forming at the connecting part between the p type extension region 40 and the p type connection layer 30. Thereby, occurrence of difficulty such as thinning of the thickness of the p type layer at the connecting part can be suppressed, and the withstanding voltage required for the power device can be secured.

Figure 9A:
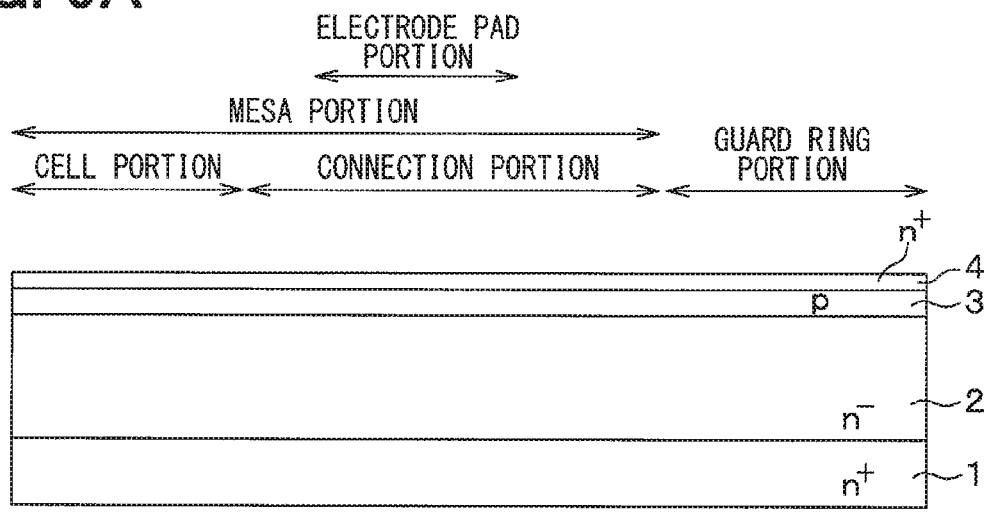
FIG. 9A is a cross-sectional view showing a state during a manufacturing process when the width of the connection layer is increased as a reference example.
Figure 9B:
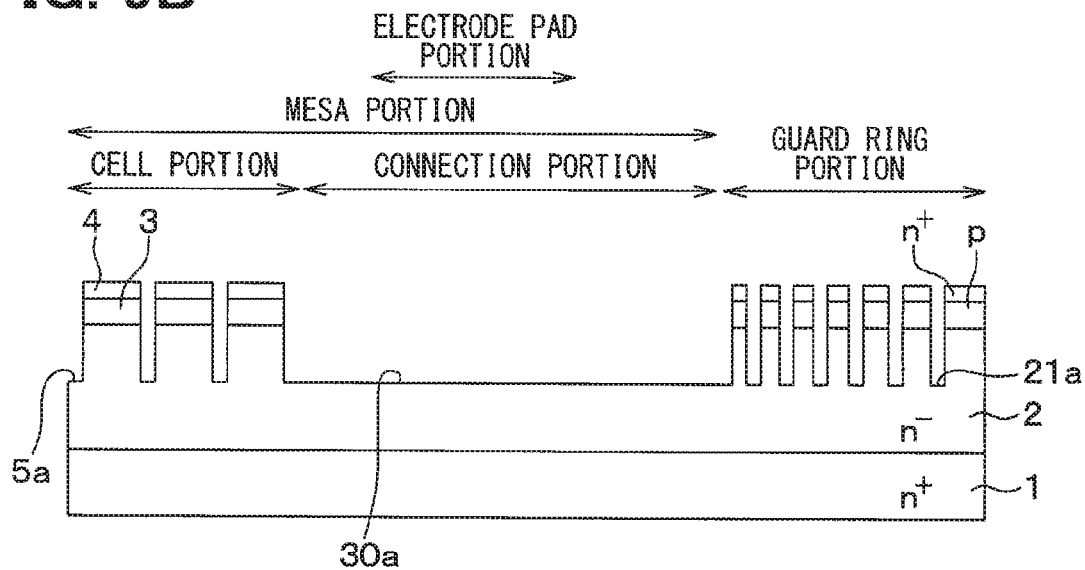
FIG. 9B is a cross-sectional view showing a manufacturing process of the SiC semiconductor device continued from FIG. 9A.
Figure 9C:
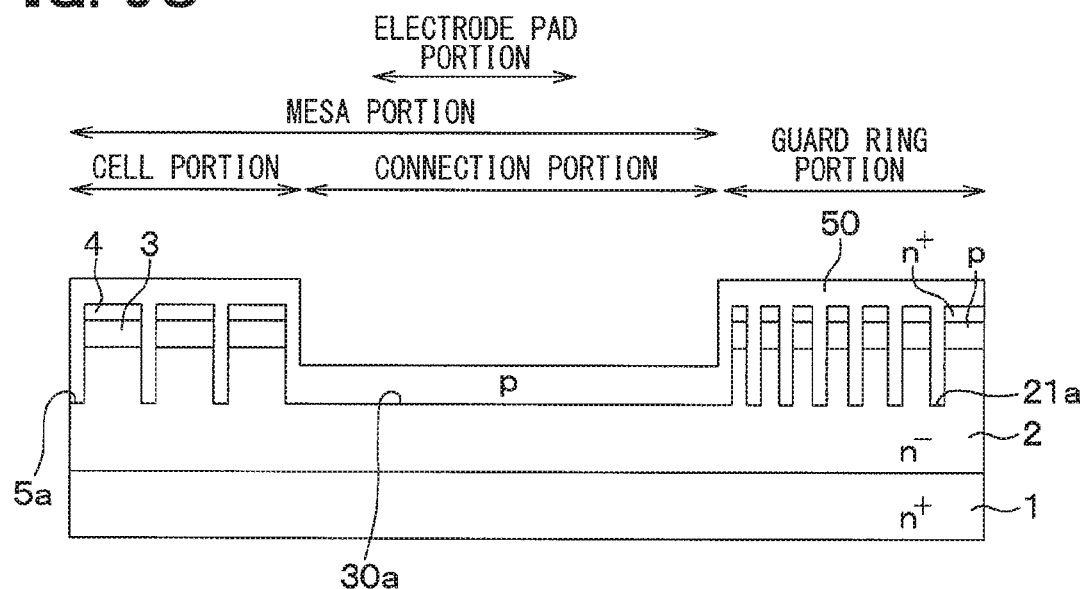
FIG. 9C is a cross-sectional view showing a manufacturing process of the SiC semiconductor device continued from FIG. 9B.
Figure 9D:
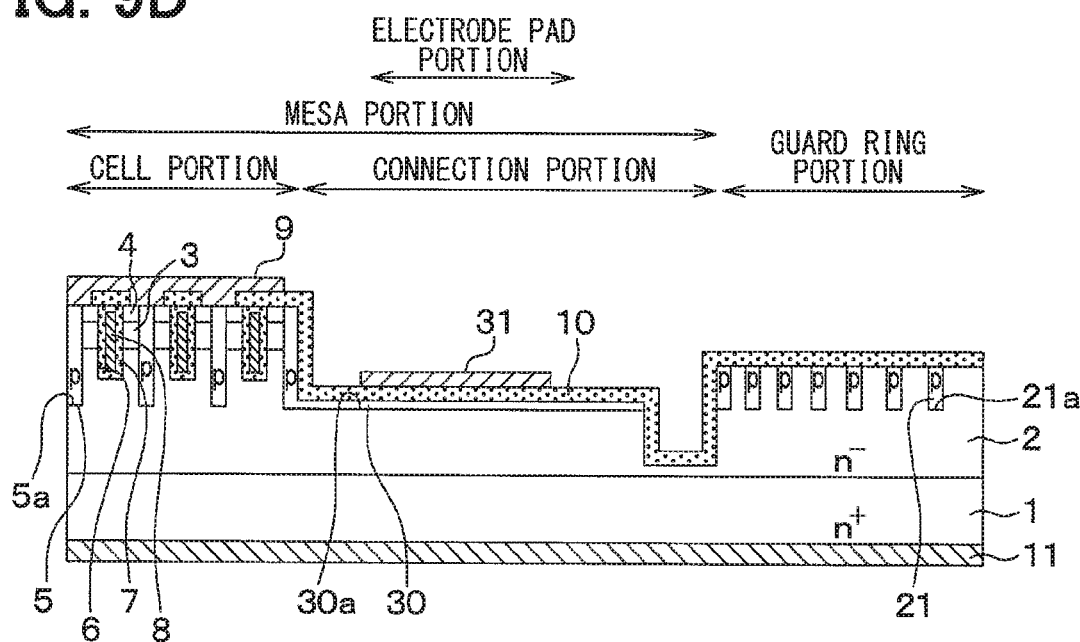
FIG. 9D is a cross-sectional view showing a manufacturing process of the SiC semiconductor device continued from FIG. 9C.

For reference, when using the epitaxial film, when the width of the p type connection layer 30 is made larger than those of the p type deep layer 5 and the p type guard ring 21, a feature such that the thickness of the p type connection layer 30 becomes thinner and an area where the p type connection layer 30 is eliminated is generated will be described with reference to the drawings. FIGS. 9A to 9D show a manufacturing process in the case where the entire region between the cell portion and the guard ring portion is formed as the p type connection layer 30 without narrowing the width of the p type connection layer 30. The steps shown in FIGS. 9A and 9B are performed similar to the steps in FIGS. 4A and 4B. At this time, the width of the trench 30a is set to be the width corresponding to the entire region from the cell portion to the guard ring portion. In the step of FIG. 9C, when the p type layer 50 is deposited in the same manner as in FIG. 4C, since the width of the trench 30a is large, the thickness of the portion of the p type layer 50 constituting the p type connection layer 30 becomes thin. Thereafter, when the p type layer 50 is etched back, the thickness of the connection layer 30 becomes thin, and the p type layer 50 remains only at the bottom of the trench 30a. Further, when etching is performed using a mask not shown which has an opening at the guard ring portion while covering the mesa portion, the connection layer 30 is completely eliminated on the outer peripheral side from the mesa portion, and further the n⁻ type drift layer 2 is etched. Therefore, as shown in FIG. 9D, in the region where the mesa portion is to be formed, the connection layer 30 becomes thin and the connection layer 30 does not exist in the region outside the mesa portion. Therefore, by narrowing the width of the connection layer 30 as in the present embodiment, it is possible to solve the difficulty such as thinning of the connection layer 30. Therefore, it is possible to secure the withstand voltage required for the power device.

Second Embodiment

A second embodiment will be described. This embodiment is provided with a hole extracting structure with respect to the first embodiment, and other features are similar to those of the first embodiment, so only the portions different from the first embodiment will be described.

Figure 10:
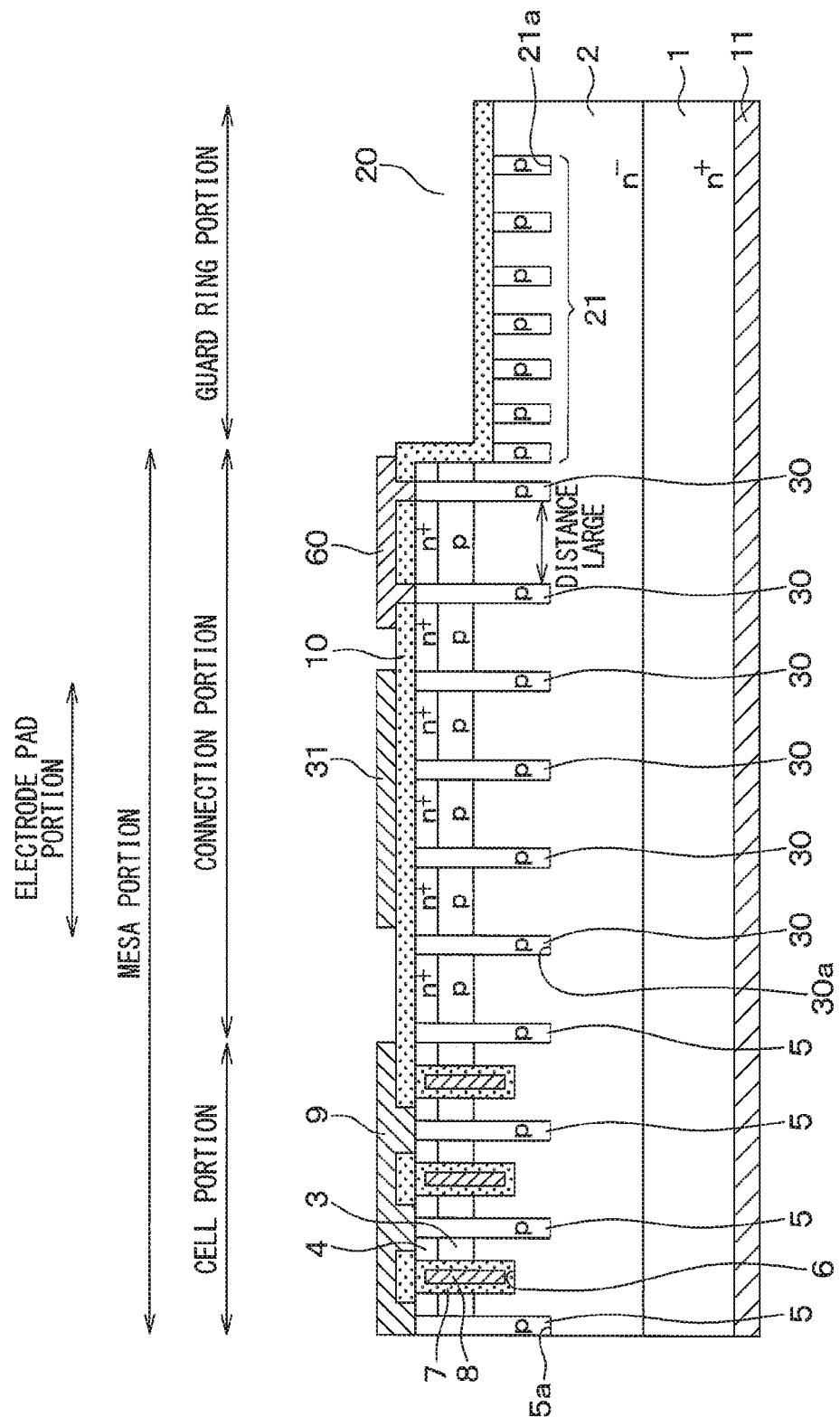
FIG. 10 is a cross-sectional view of a SiC semiconductor device according to a second embodiment.

As shown in FIG. 10, in the SiC semiconductor device of the present embodiment, a carrier extraction electrode 60 connected to the p type connection layer 30 is formed at the connection portion. In the case of this embodiment, the hole serves as a carrier.

Specifically, a contact hole is formed in a portion of the interlayer insulation film 10 where the extraction electrode 60 is formed, and the extraction electrode 60 is connected to the p type connection layer 30 through the contact hole. In addition, the interval between the p type connection layers 30 to which the extraction electrode 60 is connected is made larger than the interval of other portions such as the p type deep layers 5 and the other p type connection layers 30.

According to such a configuration, at the time of breakdown, the p type connection layer 30 connected to the extraction electrode 60 has a larger interval than the other portions, so that the rising of the equipotential line is increased, and the breakdown is preferentially made at the tip of the p type connection layer 30. Since the extraction electrode 60 is provided immediately above the p type connection layer 30, the breakdown current due to holes can be extracted without going around to the cell portion side. Therefore, it is possible to suppress the negative characteristic at the off state time, which may occur when the breakdown current goes around and reaches the cell portion side, and it is possible to prevent breakdown of the cell portion due to this characteristic.

In the case of the structure according to this embodiment, with respect to the p type connection layer 30 which is electrically connected to the extraction electrode 60, the closest distance to the other p type layer is longer than the distance between the p type deep layers 5. However, in the other portions, since the closest distance in the p type layer is equal to or smaller than the interval of the p type deep layers 5, excessive rising of the equipotential line in the other portions can be suppressed. Thereby, it is possible to preferentially cause a breakdown in a part of the p type connection layer 30 which is electrically connected to the extraction electrode 60.

Third Embodiment

A third embodiment will be described. This embodiment is a modification of the structure of the p type deep layer 5 and the like with respect to the first embodiment, and other features are similar to the first embodiment, so only the parts different from the first embodiment will be explained.

Figure 11:
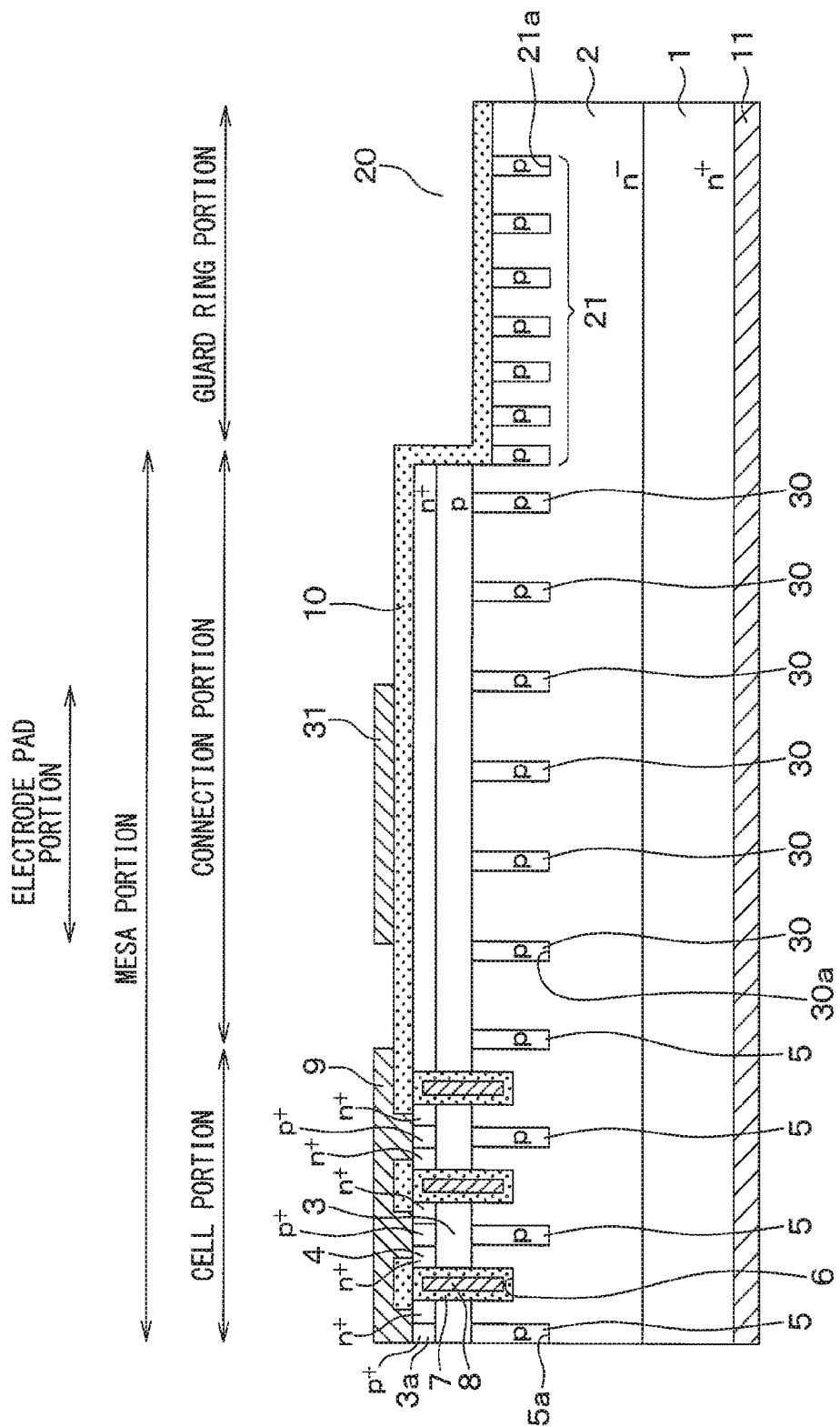
FIG. 11 is a cross-sectional view of a SiC semiconductor device according to a third embodiment.

As shown in FIG. 11, in this embodiment, the p type deep layer 5 and the p type connection layer 30 are formed only under the p type base region 3. Also, in a different cross section from FIG. 11, a p type diffusion region 40 is formed only under the p type base region 3. Then, in order to electrically connect the p type base region 3 and the source electrode 9, ion implantation is performed to the n⁺ type source region 4 so that the p⁺ type contact portion 3a is formed. As a result, the p⁺ type contact portion 3a is electrically connected to the source electrode 9, and the p type deep layer 5, the p type connection layer 30 and the p type diffusion region 40 also have the source potential through the p type base region 3. Even with such a structure, the same effect as in the first embodiment can be obtained.

In the manufacturing method of the SiC semiconductor device having such a structure, after forming the n⁻ type drift layer 2 and before forming the p type base region 3, the p type layer 50 is formed and etched back. Thus, the p type deep layer 5, the p type connection layer 30, the p type guard ring 21 and the p type diffusion region 40 are formed. Further, after forming the n⁺ type source region 4, ion implantation of p type impurity is performed at a position corresponding to the p type deep layer 5 in the n⁺ type source region 4 using a mask not shown, so that a step for forming the p⁺ type contact portion 3a is carried out. The other steps are the same as those in the first embodiment.

Fourth Embodiment

A fourth embodiment will be described. In this embodiment, a junction barrier Schottky diode (hereinafter referred to as JBS) is provided instead of the vertical MOSFET as the power element in the first embodiment. Since the others are the same as those in the first embodiment, only the parts different from the first embodiment will be described.

Figure 12:
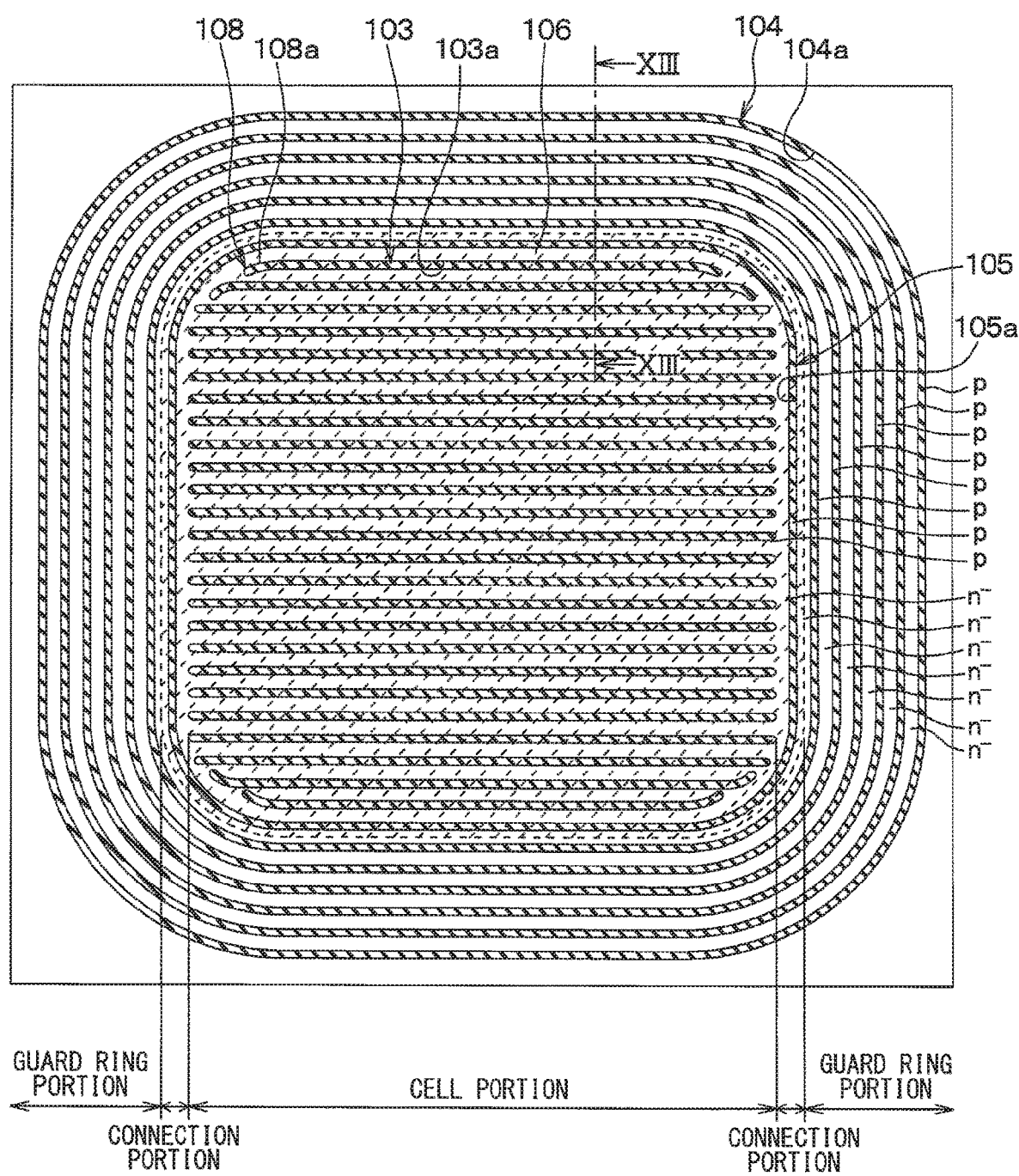
FIG. 12 is a diagram schematically showing a top layout of a SiC semiconductor device according to a fourth embodiment.
Figure 13:
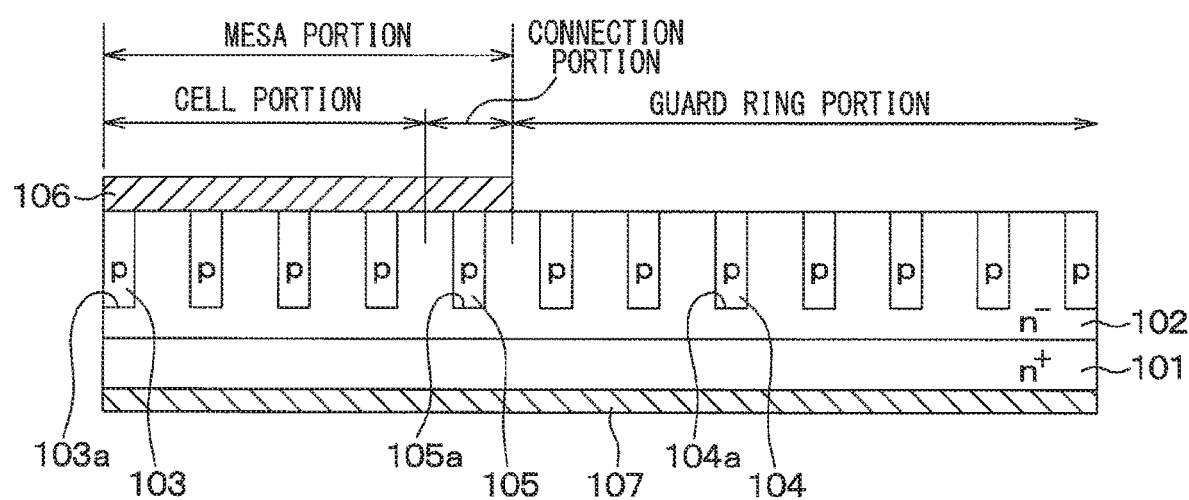
FIG. 13 is a cross-sectional view taken along the line IIIX-IIIX in FIG. 12.

The SiC semiconductor device according to this embodiment will be described with reference to FIGS. 12 and 13. As shown in FIG. 13, an n⁻ type drift layer 102 is formed on an n⁺ type substrate 101. As shown in FIGS. 12 and 13, in the cell portion, a stripe-shaped p type deep layer 103 is formed with respect to the n⁻ type drift layer 102, and in the guard ring portion surrounding the p type deep layer 103, the p type guard ring 104 is formed. In addition, a p type connection layer 105 is also formed at the connection portion between the cell portion and the guard ring portion.

The p type deep layer 103 is disposed in each of a plurality of stripe-shaped trenches 103a which are arranged at equal intervals in the n⁻ type drift layer 102, and the deep layer 103 is made of a p type epitaxial film by epitaxial growth. The trench 103a corresponds to a deep trench, and has a depth of, for example, 1 micrometer or less and an aspect ratio of 2 or more. In addition, the tip of the p type deep layer 103 has a semicircular top shape.

The p type guard ring 104 is disposed in the trench 104a formed in the n⁻ type drift layer 102, and is made of a p type epitaxial film by epitaxial growth. The interval between the p type guard rings 104 is set to be equal to the interval between the adjacent p type deep layers 103. Alternatively, the interval may be increased toward the outer peripheral side. The trench 104a corresponds to a guard ring trench, and has a depth of, for example, 1 micrometer or less and an aspect ratio of 2 or more. In the case of the present embodiment, the p type guard ring 104 has a quadrangular shape in which the four corners are rounded. Alternatively, the ring 104 may have another frame shape such as a circular shape.

The p type connection layer 105 is disposed in the trench 105a formed in the n⁻ type drift layer 102, and is made of a p type epitaxial film by epitaxial growth. The trench 105a corresponds to a connection trench, and has a depth of, for example, 1 micrometer or less and an aspect ratio of 2 or more. In the case of the present embodiment, the p type connection layer 105 has a structure in which one or a plurality of frame shapes surrounding the periphery of the p type deep layer 103 formed in the cell portion are arranged. In the present embodiment, the number of the p type connection layer 105 is one, and the distance between the p type connection layer 105 and the adjacent p type guard ring 104 is set to be equal to the distance between p type guard rings 104 and the distance between the p type deep layers 103. In the case where there are a plurality of p type connection layers 105, the interval between the p type connection layers 105 may be arranged at equal intervals, which is equal to the interval between the p type deep layers 103, or the interval may become wider toward the outer peripheral side.

A Schottky electrode 106 corresponding to the first electrode in contact with the surface of the n⁻ type drift layer 102, the p type deep layer 103 and the p type connection layer 105 is formed in the cell portion and the connection portion. That is, in the case of the present embodiment, a plurality of p type rings made of a p type layer, which is provided by an epitaxial film in a frame-shaped trench with a frame shape surrounding a cell portion, are arranged, and a Schottky electrode 106 is disposed so as to cover a part of the p type rings on the inner circumferential side. Among such plural p type rings, the p type ring in contact with the Schottky electrode 106 is defined as a p type connection layer 105. Further, among the plurality of p type rings, the p type ring, which are not in contact with the Schottky electrode 106 but are positioned at the outer side from the Schottky electrode 106 and are disposed at the position where the n⁻ type drift layer 102 is exposed, is defined as a p type guard ring 104. In the portion where the Schottky electrode 106 is formed, in the thickness direction of the n⁺ type substrate 101, the position of the cell portion where the Schottky electrode 106 is arranged and the position of the connection portion are protruded from the guard ring portion so as to form the mesa portion.

Further, an ohmic electrode 107 corresponding to the second electrode is formed on the back side of the n⁺ type substrate 101.

In this way, when the JBS including the p type deep layer 103 in contact with the Schottky electrode 106 is provided, as shown in FIG. 12, the p type extension region 108 is connected to the tip portion of the p type deep layer 103.

The p type extension region 108 is disposed in the trench 108a formed in the n⁻ type drift layer 102, and is made of a p type epitaxial film by epitaxial growth. The trench 108a corresponds to an extension trench, and has a depth of, for example, 1 micrometer or less and an aspect ratio of 2 or more. The basic configuration of the p type extension region 108 is similar to that of the p type extension region 40 described in the first embodiment. That is, the p type extension region 108 is arranged to protrude inward of a place where the gap generated between the both ends of the p type deep layer 103 and the innermost p type guard ring 104 located on the innermost peripheral side becomes large. In addition, the tip of the p type extension region 108 also has a semicircular top shape.

As described above, also in the SiC semiconductor device having the JBS as the power element, a structure having the p type extension region 108 at the tip portion of the p type deep layer 103 can be applied. Even with such a structure, the same effect as in the first embodiment can be obtained. Since such an effect can be obtained, in the SiC semiconductor device having the JBS, the Schottky electrode 106 can be made to have a small barrier height, the on-state voltage can be reduced, and the surface electric field can be reduced. Further, as compared with the case where a p type layer such as the p type deep layer 103 is formed by ion implantation method, defects are less likely to occur, so that reverse leakage can also be reduced.

Other Embodiment

Although the present disclosure is made based on the embodiments described above, the present disclosure is not limited to such embodiments but includes various changes and modifications which are within equivalent ranges. Furthermore, various combinations and modes, as well as other combinations and modes each obtained by adding only one or more elements to or removing any element from corresponding one of the various combinations and modes will fall within the scope and the ideological scope of the present disclosure.

(1) For example, in each of the above-described embodiments, the case where the both ends in the longitudinal direction of the p type connection layer 30, the p type deep layer 103 or the p type extension regions 40 and 108 are semicircular has been described. Alternatively, the tip of each ends may be a pointed triangle shape, or a quadrangular shape with a flat surface end. In the case of a triangular shape, when the extending direction of the p type connection layer 30 and the p type deep layer 103 is the <11-20> direction, in a hexagonal crystal structure such as SiC, the plane orientation of the wall for constituting the two sides of the tip, which is triangular, tends to be equivalent (1-100) plane. Therefore, the growth at the epitaxial embedding process on each equivalent surface becomes uniform so as to form the uniform film quality and to obtain the effect of suppressing the embedding failure.

(2) In the first and third embodiments, the distance between the p type deep layers 5 is equal to the interval between the p type connection layers 30. Alternatively, these intervals may not be necessarily equal to each other.

(3) In the third embodiment, in order to connect the p type base region 3 and the p type connection layer 30 to the source electrode 9, the p⁺ type contact region 3a is formed to penetrate the n⁺ type source region 4 and to reach the p type base region 3. Alternatively, a trench penetrating the n⁺ type source region 4 may be formed so that the source electrode 9 directly contacts the p type base region 3.

(4) In each of the above embodiments, the n⁺ type source region 4 is epitaxially grown continuously on the p type base region 3. Alternatively, the n⁺ type source region 4 may be formed by implanting ions of n type impurity at a desired position of the p type base region 3.

(5) Further, the structure including the extraction electrode 60 described in the second embodiment can be applied to the structure of the third embodiment. In the case of the structure in which the p type deep layer 5 and the p type connection layer 30 are formed from the surface of the n⁻ type drift layer 2 as in the third embodiment, on the outer peripheral side of the connection portion, the p type contact layer connecting to the p type connection layer 30 is formed so as to electrically connect the extraction electrode 60 and the p type connection layer 30. By doing so, it is possible to obtain a structure capable of obtaining the same effect as in the second embodiment.

(6) In each of the above embodiments, an n channel type inverted trench gate MOSFET or a Schottky diode has been described as an example of a vertical power element. Each of the above embodiments merely shows one example of a vertical type semiconductor element. Therefore, alternatively, a vertical type semiconductor element may have another structure and/or another conductivity type as long as the vertical type semiconductor element flows a current between a first electrode provided on the front surface side of the semiconductor substrate and a second electrode provided on the back surface side.

For example, in the first embodiment, an n channel type MOSFET in which the first conductivity type is n type and the second conductivity type is p type has been described as an example. Alternatively, the conductivity type of each element may be reversed so as to form a p channel type MOSFET. In the above description, the MOSFET is described as an example of a semiconductor element. Alternatively, the present disclosure may also be applied to an IGBT having a similar structure. In the IGBT, only the conductivity type of the n$^+$ type substrate 1 is changed from the n type to the p type with respect to each of the above embodiments, and other structures and manufacturing methods are the same as those of the above embodiments. Furthermore, the trench gate structure in the vertical type MOSFET has been described as an example. Alternatively, it is not limited to a trench gate structure and may be a planar type MOSFET.

(7) In the first to third embodiments, the p type guard ring 21 has a frame shape with an arc-shape portion, and the p type connection layer 30 has a stripe shape. Alternatively, a p type connection layer 30 may have a frame shape with an arc-shape portion at the outer circumferential position of the connection portion. In that case, the p type extension region 40 is provided between the tip portion of the stripe shaped p type connection layer 30 and the p type connection layer 30 having a frame shape with the arcuate portion. That is, what is referred to as a p type guard ring 21 is a part of the p type rings that is made of the p type layer having the ring shape by forming the epitaxial film in the trench having the frame shape, the part arranged outside from the mesa portion. A part of the p type rings which is arranged in the mesa portion constitute a part of the connection layer formed in the connection portion. The SiC semiconductor device having the JBS is similar as in the fourth embodiment.

Therefore, in each of the above embodiments, a part of the deep trenches and a part of the connection trenches having a plurality of lines with a stripe shape correspond to the first trench, and a portion of the guard ring trench and a part of the connection trench having a line with a frame shape corresponds to the second trench. In addition, the p type ring here corresponds to a second conductivity type ring.

(8) In the case of indicating the crystal orientation, a bar (−) should be added over a desired number properly. Since there is restriction on expression based on electronic filing, in the present specification, a bar is attached before a desired number.

The invention claimed is:

1. A silicon carbide semiconductor device having a cell portion and an outer peripheral portion that includes a guard ring portion surrounding an outer periphery of the cell portion and a connection portion positioned between the guard ring portion and the cell portion, the semiconductor device comprising:
   a substrate having a first conductivity type or a second conductivity type; and
   a drift layer having the first conductivity type, arranged on a surface of the substrate, and having an impurity concentration lower than the substrate, wherein:
   the cell portion, or the cell portion and the connection portion includes a second conductivity type layer that is arranged in a plurality of line-shaped first trenches having a stripe shape and disposed in the drift layer, and is made of an epitaxial film having the second conductivity type;
   the cell portion includes a vertical type semiconductor element that has: a first electrode electrically connected to the second conductivity type layer; and a second electrode arranged on a back side of the substrate, and flows a current between the first electrode and the second electrode;
   the guard ring portion includes a second conductivity type ring that is arranged in a plurality of line-shaped second trenches having a stripe shape, disposed from a surface of the drift layer, and surrounding the cell portion, and is made of an epitaxial film having a second conductivity type; and
   a top end of the second conductivity type layer includes an extension region made of an epitaxial film having the second conductivity type and arranged in an extension trench that is connected to a tip of each of the plurality of first trenches, protrudes only in a direction toward an adjacent second conductivity type layer among a plurality of second conductivity type layers, is arranged to be spaced apart from the adjacent second conductivity type layer, and has a line shape.

2. The silicon carbide semiconductor device according to claim 1, wherein:
   the second conductivity type ring has an arc shape portion; and
   the extension region is arranged at the top end of the second conductivity type layer at a position corresponding to the arc shape portion of the second conductivity type ring.

3. The silicon carbide semiconductor device according to claim 2, wherein:
   the extension region has an arc shape that is the same as the arc shape of the second conductivity type ring.

4. The silicon carbide semiconductor device according to claim 1, wherein:
   a top end of the extension region in a longitudinal direction has an upper surface with a semicircular shape when viewed from an upside of the substrate.

5. The silicon carbide semiconductor device according to claim 1, wherein:
   a closest distance from a top end of the extension region in the longitudinal direction to the second conductivity type ring is equal to or smaller than twice an elongation amount of a depletion layer extending from the extension region to the drift layer when the semiconductor element turns off.

6. The silicon carbide semiconductor device according to claim 1, wherein:
   at least a part of the second conductivity type ring, which is disposed on an outer peripheral side of the cell portion, is defined as the guard ring portion;
   in a thickness direction of the substrate, the cell portion and the connection portion protrude from the guard ring portion to provide a mesa portion having an island shape; and
   in an entire region of the mesa portion, a closest distance between the second conductivity type layer and the extension region or the second conductivity type ring is equal to or less than an interval between a plurality of deep layers of the cell portion.

7. The silicon carbide semiconductor device according to claim 6, further comprising:
an extraction electrode that is electrically connected to a first part of the second conductivity type layer and a second part of the second conductivity type layer located at the connection portion, and extracts a carrier at a time of breakdown.

8. The silicon carbide semiconductor device according to claim 7, wherein:
an interval between the first and second parts of the second conductivity type layer is larger than the interval between the second conductivity type layers arranged in the cell portion, the first and second parts being electrically connected to the extraction electrode.

9. The silicon carbide semiconductor device according to claim 1, wherein:
the vertical type semiconductor element of the cell portion has:
a base region having the second conductivity type and arranged on the drift layer;
a source region having the first conductivity type, arranged above the base region, and having an impurity concentration higher than the drift layer;
a trench gate structure with a gate insulation film that is arranged in a gate trench positioned from the surface of the source region to a depth deeper than the base region, and is located on an inner wall of the gate trench, and a gate electrode arranged on the gate insulation film;
a deep layer providing at least a part of the second conductivity type layer, and arranged in a deep trench that is included in at least a part of the first trenches and is located to a position deeper than the gate trench in the drift layer;
the first electrode is a source electrode electrically connected to the source region and the base region; and
the second electrode is a drain electrode and arranged on the back side of the substrate.

10. The silicon carbide semiconductor device according to claim 1, wherein:
the substrate has the first conductivity type; and
the vertical type semiconductor element of the cell portion is a vertical type Schottky diode that has:
a deep layer disposed in a deep trench included in at least a part of the first trenches, and providing at least a part of the second conductivity type layer;
the first electrode is a Schottky electrode which contacts the drift layer and the deep layer; and
the second electrode is an ohmic electrode disposed on the back side of the substrate.

* * * * *